US012737509B1

(12) United States Patent
Oxman et al.

(10) Patent No.: US 12,737,509 B1
(45) Date of Patent: Sep. 15, 2026

(54) NEURAL FIELD BASED OPTIMIZATION OF AN ECOSYSTEM DESIGN

(71) Applicant: NEOX Public Benefit LLC, New York, NY (US)

(72) Inventors: Neri Oxman, New York, NY (US); Christoph Bader, New York, NY (US); Nicolas Lee, Earlysville, VA (US)

(73) Assignee: NEOX Public Benefit LLC, New York, NY (US)

( * ) Notice: Subject to any disclaimer, the term of this patent is extended or adjusted under 35 U.S.C. 154(b) by 0 days.

(21) Appl. No.: 19/288,419

(22) Filed: Aug. 1, 2025

Related U.S. Application Data

(60) Provisional application No. 63/678,209, filed on Aug. 1, 2024.

(51) Int. Cl.
*G06F 30/13* (2020.01)

(52) U.S. Cl.
CPC .................................... *G06F 30/13* (2020.01)

(58) Field of Classification Search
CPC ........................................................ G06F 30/13
See application file for complete search history.

(56) References Cited

U.S. PATENT DOCUMENTS

2016/0305678 A1* 10/2016 Pavlovski .............. G05B 15/02
2017/0329875 A1* 11/2017 Detwiler ................ G06Q 10/06
2024/0161470 A1 5/2024 Smichisescu et al.
2024/0241287 A1* 7/2024 Luo ......................... G01W 1/10

FOREIGN PATENT DOCUMENTS

CN 106547880 B 5/2020

OTHER PUBLICATIONS

J. M. Paruelo, F. Tomasel, Prediction of functional characteristics of ecosystems: a comparison of Artificial neural networks and regression models, pp. 173-186, (Year: 1997).*
Hu et al., "Dual-stage Flows-based Generative Modeling for Traceable Urban Planning", arXiv, Oct. 3, 2023, 10 pages.

* cited by examiner

*Primary Examiner* — Kibrom K Gebresilassie
(74) *Attorney, Agent, or Firm* — DORITY & MANNING, P.A.

(57) ABSTRACT

Techniques for generating an architectural design for a given site map are described herein. The system can include a generative system configured to process a distribution of parameters to generate a result for the site map and an optimizer configured to determine an update for the distribution of parameters to optimize for one or more performance metrics. The system can obtain, from memory, the distribution of parameters. Additionally, the system can process, using the generative system, the distribution of parameters to generate a first result, the first result being associated with a digital representation of the architectural design for the specific site map. Moreover, the system can calculate, using a fitness function, a first performance value associated with the one or more performance metrics based on the first result. Furthermore, the system can determine, using the optimizer, an update for the distribution of parameters based on the first result.

20 Claims, 14 Drawing Sheets

NEURAL FIELD BASED OPTIMIZATION OF AN ECOSYSTEM DESIGN

CROSS-REFERENCE TO RELATED APPLICATIONS

This application claims priority to U.S. Provisional Patent Application No. 63/678,209, filed Aug. 1, 2024, and titled "NEURAL FIELD BASED OPTIMIZATION OF AN ECOSYSTEM DESIGN", the content of which is hereby expressly incorporated herein by reference in its entirety.

FIELD

The present disclosure relates generally to machine learning processes and machine-learned devices and systems. More particularly, the present disclosure relates to optimizing the parameters of a generative model for generating designs (e.g., architectural designs for a site map) by sampling and evaluating distributions of potential outputs.

BACKGROUND

While generative models are powerful for tasks within the distribution of the training data, they struggle with out-of-distribution problems because the generative model may not be designed to generalize beyond the patterns seen during training. Thus, a limitation of generative models includes dealing with data that lies outside the scope of the distribution they were trained on. Generative models are trained on existing data and learn to generate new data samples by modeling the distribution of the training data. The generative models can estimate the probability distribution of the training data, and can generate new, similar samples that adhere to this learned distribution.

Out-of-distribution problems involve data that do not conform to the patterns or structures seen in the training data, such as novel scenarios, anomalies, or rare events that were not represented during training. Since generative models are designed to replicate the distribution of the training data, they are typically not equipped to handle or generate meaningful data that falls outside of this distribution. When faced with out-of-distribution data, generative models might fail to generate plausible samples or provide accurate predictions. Solving out-of-distribution problems requires different approaches that can adapt to or recognize novel data.

SUMMARY

Aspects and advantages of embodiments of the present disclosure will be set forth in part in the following description, or can be learned from the description, or can be learned through practice of the embodiments.

Example aspects of the present disclosure provide an example computing system that includes one or more processors and one or more example non-transitory computer-readable media storing instructions that are executable by one or more processors to cause a computing system to perform example operations. The system can include a generative system configured to process a distribution of parameters to generate a result for the site map. Additionally, the system can include an optimizer configured to determine an update for the distribution of parameters to optimize for one or more performance metrics. In some implementations, the example operations can include obtaining, from memory, the distribution of parameters. Additionally, the operations can include processing, using the generative system, the distribution of parameters to generate a first result. The first result can be associated with a digital representation of the architectural design for the specific site map. Moreover, the operations can include calculating, using a fitness function, a first performance value associated with the one or more performance metrics based on the first result. Furthermore, the operations can include determining, using the optimizer, an update for the distribution of parameters based on the first result.

In some instances, the operations can further include generating, based on the first result, the digital representation of the architectural design. Additionally, the operations can include causing a presentation, on a user device, the digital representation of the architectural design when the first performance value exceeds a threshold value.

In some instances, the operations can further include storing, in memory, the distribution of parameters. The update to the distribution of parameters can include a modification to at least one parameter in the distribution of parameters.

In some instances, the operations can include, for a plurality of iterations until an updated performance value exceeds a threshold value, obtaining, from memory, the distribution of parameters; processing, using the generative system, the distribution of parameters to generate an updated result, the updated result being an updated digital representation of the architectural design for the specific site map; calculating, using the fitness function, the updated performance value associated with the one or more performance metrics based on the updated result; and determining, using the optimizer, an update for the distribution of parameters based on the updated result.

In some instances, the operations can further include processing, using the optimizer, the first result to generate a second distribution of parameters. Additionally, the operations can include processing, using the generative system, the second distribution of parameters to generate a second result. Moreover, the operations can include calculating, using the fitness function, a second performance value associated with the one or more performance metrics based on the second result. Furthermore, the operations can include performing an action based on a comparison of the performance value and the second performance value.

In some instances, the operations can further include obtaining, from a user device, a targeted performance metric. The update for the distribution of parameters can be further based on the targeted performance metric.

In some instances, the update for the distribution of parameters can be further based on the first performance value.

In some instances, the design construct can be a landscape topology designed for a given site.

In some instances, the design construct is the design of a building to be constructed on a given site.

In some instances, the operations can further include obtaining a mesh representation of the site map. Additionally, the operations can include training the generative system using the mesh representation of the site map.

In some instances, the operations can further include processing, using the fitness function, the first result and historical environmental data to calculate the first performance value. The historical environmental data can have wind data and sunlight data for the site map.

In some instances, the distribution of parameters is a parameterized distribution function. For example, the parameterized distribution function can be generated using a Gaussian algorithm. Additionally, in one example, two parameters of the distribution of parameters are controlled by the Gaussian algorithm.

In some instances, the optimizer is a natural evolution strategy optimization algorithm.

In some instances, the optimizer is a stochastic neural architecture search (SNAS) algorithm.

In some instances, the generative system is a combination of a procedural system and a machine-learned model.

In some instances, the generative system is a diffusion model.

In some instances, one or more performance metrics include a quantifiable volume of sunlight on an object located on the site map, carbon sequestration value of the site map, surface temperature of an object on the site map, or water retention associated with the site map.

Example aspects of the present disclosure provide an exemplar method for generating an architectural design for a given site map. In some implementations, the exemplar method can include obtaining, from memory, the distribution of parameters. Additionally, the method can include processing, using a generative system, the distribution of parameters to generate a first result, the first result being associated with a digital representation of the architectural design for the specific site map. Moreover, the method can include calculating, using a fitness function, a first performance value associated with one or more performance metrics based on the first result. Furthermore, the method can include determining, using an optimizer, an update for the distribution of parameters based on the first result, the optimizer being configured to optimize for the one or more performance metrics.

Example aspects of the present disclosure provide one or more example non-transitory computer-readable media storing instructions that are executable by one or more processors to cause a computing system to perform example operations. In some implementations, the example operations can include obtaining the distribution of parameters. Additionally, the operations can include processing, using a generative system, and the distribution of parameters to generate a first result. The first result can be associated with a digital representation of the architectural design for the specific site map. Moreover, the operations can include calculating, using a fitness function, a first performance value associated with one or more performance metrics based on the first result. Furthermore, the operations can include determining, using an optimizer, an update for the distribution of parameters based on the first result, the optimizer being configured to optimize for the one or more performance metrics.

Other example aspects of the present disclosure can be applied to other systems, methods, apparatuses, tangible non-transitory computer-readable media, and devices for performing functions described herein. These and other features, aspects, and advantages of various implementations will become better understood with reference to the following description and appended claims. The accompanying drawings, which are incorporated in, and constitute a part of this specification, illustrate implementations of the present disclosure and, together with the description, help explain the related principles.

DETAILED DESCRIPTION

Figure 1:
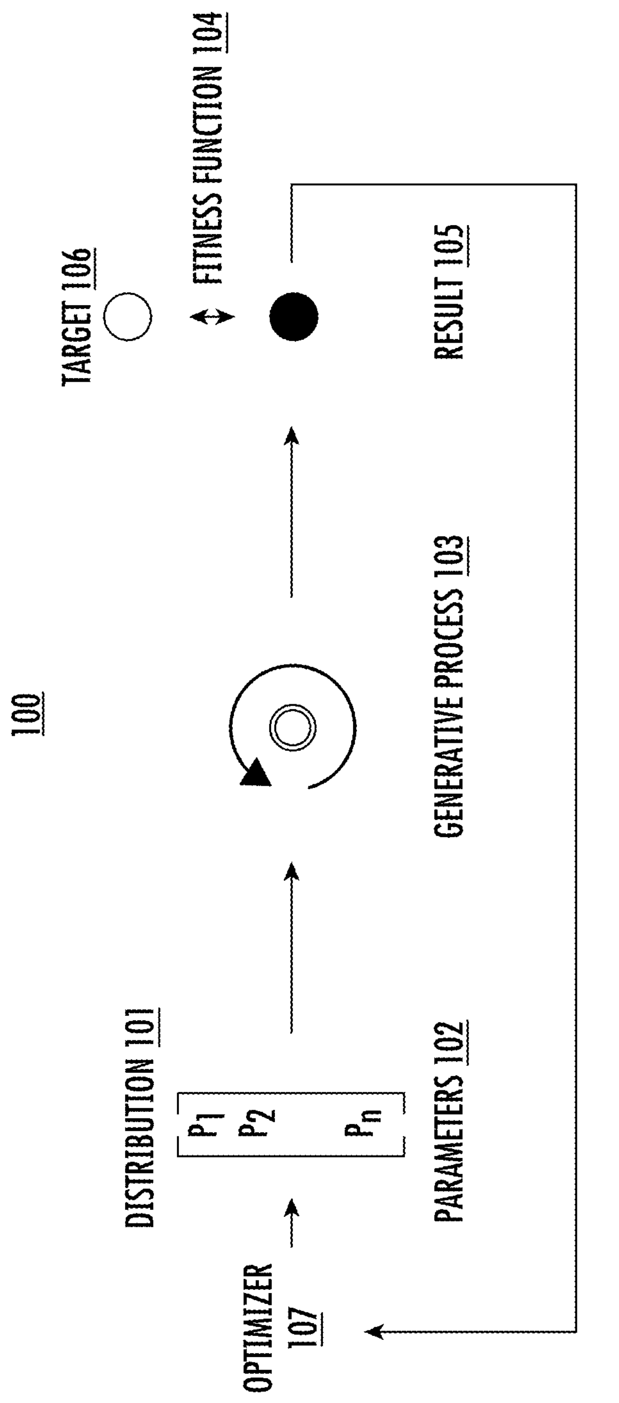
FIG. 1 is a flow diagram of an example system architecture for distribution based generative optimization according to example implementations of aspects of the present disclosure.

Generally, the present disclosure is directed towards techniques for generating architectural designs for a site map that optimize for a given performance metric. Ecosystems and landscapes can provide robust services including the sequestration of atmospheric carbon dioxide, the filtration and purification of water and air, the production of raw materials and the recycling of waste, as well as additional services associated with a given architectural program. Techniques described herein improve design processes that directly shape landscapes, such as architecture, landscape, and urban planning, to optimize performance metrics by creating configurations that ensure the resilience and productivity of ecosystems on a given site. The system described herein generates workflows that can rapidly examine various configurations of a design space and predict the impact that each of them may have on the ecosystem parameters of interest. Subsequently, the system can generate an architectural design that optimizes one or more performance metrics.

Additionally, the system can iteratively optimize for configurations that yield productive, resilient ecosystems. The system utilizes an optimizer to find an optimal solution by minimizing or maximizing a given objective function for a given performance metric. The system can determine an optimal set of parameters that yields the highest performance according to the specified criteria. In some instances, the optimizer is designed to find specific solutions that are best suited to the objective function, often resulting in a single, optimal candidate solution. Moreover, the set of parameters that are optimized by the optimizer can be inputted into a generative system (e.g., generative process, generative method) to generate a result associated with an architectural design for the site.

According to some embodiments, the system described herein can include a generative system that generates a result (e.g., architectural design) based on a distribution of parameters. Additionally, the system includes a fitness function (e.g., objective function) that can model the performance metrics (e.g., biodiversity on the site, amount of sunlight, carbon sequestration rates, runoff rates, air filtration). Subsequently, the result from the generative system is also inputted into an optimizer to update one or more parameters of the distribution of parameters.

Additionally, the system can iteratively optimize for configurations that yield productive, resilient ecosystems. The system utilizes an optimizer to find an optimal solution by minimizing or maximizing a given objective function for one or more performance metrics. The system can determine an optimal set of parameters (e.g., distribution of parameters) that yields the highest performance according to the specified performance metric. The optimizer is designed to find specific solutions that are best suited to the particular objective function associated with a performance metric, often resulting in a single, optimal candidate solution. As part of the iterative process, the set of parameters that are optimized by the optimizer can be input into a generative system to generate a result associated with an architectural design for the site.

Generative optimization is well-suited for a wide array of applications. For architectural design and space planning, it can be used to generate optimal building layouts, considering factors such as spatial efficiency, natural lighting, and energy consumption. By learning from design rules, human preferences, and building regulations, the algorithms can generate solutions that meet multiple design objectives. Generative optimization can also be applied to optimize the shape and topology of structural and performative elements such as beams, columns, trusses, heating and cooling systems, glazing, and insulation. It can offer solutions that minimize material usage and weight while satisfying structure and performance needs. For urban planning and transportation design, generative optimization can enable the development of smart and sustainable urban environments by optimizing the placement of public facilities, land use, and transportation networks. It can be used to minimize traffic congestion, reduce environmental impact, and enhance the overall quality of life for citizens.

Further, generative optimization can be employed to discover new materials or optimize existing ones in many industries, such as in the construction industry and footwear industry. Using techniques described herein, the system can utilize machine-learned models, algorithms, data, and simulations, to discover new materials or optimize existing materials. By exploring the vast space of possible material compositions, the system can identify the optimal material for a given application, such as a lightweight structure, energy-efficient building, or high-strength component. The system can receive objectives, such as maximizing strength and durability, minimizing weight and cost, or finding the optimal balance between these properties. Additionally, the system can identify limitations, such as manufacturing capabilities, environmental impact, and regulatory requirements.

Subsequently, the system can utilize generative design algorithms (e.g., Genetic Algorithms (GA), Particle Swarm Optimization (PSO), and Gradient-Based Methods) and utilize machine learning techniques (e.g., neural networks) for predictive modeling. Furthermore, the system can utilize simulation models to predict the performance of new or updated material compositions. For example, these models can include finite element analysis for mechanical properties and computational fluid dynamics for breathability and comfort. The system can explore a wide range of material combinations, iteratively generate new compositions, test the results against the objectives and constraints, and refine the results. Moreover, according to some embodiments, the system can create prototypes (e.g., shoe prototypes) of the most promising materials identified through generative optimization. The system can conduct rigorous physical testing to validate the simulated results, assessing factors such as real-world durability, comfort, and performance under various conditions. The system can use the results from physical testing to refine the machine-learned models. This feedback loop ensures continuous improvement and adaptation of the material optimization process.

For product design, generative optimization can be utilized to optimize the shape and functionality of various products, from consumer electronics to furniture. By learning from performance simulation, user preferences, and usage patterns, the process can generate designs that balance aesthetics, functionality, buildability, and manufacturability. Computational processes are often post-form creation and optimization focused. In other words, they require an existing structure to simulate and analyze. Generative optimization is differentiated by allowing for the generation of holistic structures directly from the input data. Additionally, rather than isolating analysis parameters such as airflow analysis or energy efficiency, the system takes a comprehensive approach and addresses the plurality of parameters as one, thus promoting a single solution that tackles a wide array of requirements and challenges. Furthermore, generative processes are usually criteria-led, meaning they generate many solutions based on parameters such as adjacency preferences, daylight, productivity, work style references, and exterior views. While traditional input data is primarily human-centric, the system aims to create an iterative computational conversation between ecology-relevant input data, environmental building systems, and nature-centric parameters.

In some instances, the system can create a design framework that empowers local ecosystems. For example, key environmental metrics (e.g., biodiversity, resiliency, and ecosystem services) can be quantified as performance metrics so that the system can optimize these metrics. A biodiversity metric can measure the total number of species existing within an ecosystem. In healthy ecosystems, higher numbers of species coexist and compensate for each other's individual weaknesses, leading to the efficient cycling of nutrients and energy with little waste. A resiliency metric can be based on the ability of the species to adapt to environmental changes and rebound from trauma. For example, the more diverse an ecosystem is, the more likely it is to recover from destabilizing events such as extreme climate or pathogens. Lastly, ecosystem services metric can be associated with the outputs from an environment that humans rely upon for survival such as the production of fresh air, purified water, and the sequestration of greenhouse gasses. When ecosystems grow biodiverse and resilient, they become more effective at performing each of these functions and humans benefit in turn.

The optimization of the site's biodiversity, resilience, and ecosystem services is achieved by leveraging state-of-the-art artificial intelligence (AI) tools and generative algorithms to explore a vast array of designs and determine which will yield the greatest positive environmental impacts. This exploration can be tailored towards specific applications such as the remediation of polluted landscapes or the creation of protective habitats for keystone species but will invariably prioritize the maximization of the environmental health metrics. On-site data related to species count and abundance, soil composition, climate, and atmosphere will be continually gathered in order to determine modifications that will further improve the site's health and performance.

The system can include a generative system that is trained by processing a large quantity of data on the biology, behavior, and ecological requirements of various plant and animal species, as well as data on environmental conditions and ecosystem interactions of a site. This training data can provide the foundation for an AI-driven design framework, revealing insights and increasing our understanding—along with unique needs and characteristics—of the targeted ecosystems. Applying methods from machine learning and deep reinforcement learning, this enables the machine-learned models to learn from real-world interactions and determine which configurations of materials, species, and design strategies will yield optimal structural and environmental performance. This iterative process can ensure that any specified architectural solutions remain highly effective in promoting the well-being of targeted ecosystems, in addition to humans.

Additionally, the system can explore the vast solution space of architectural configurations deploying generative algorithms. These algorithms can create an array of potential designs, iteratively refining them to maximize ecological benefits while ensuring that human needs are met and minimizing resource use. Factors considered as part of the optimization process include environmental conditions, habitat connectivity, resource availability, ecosystem stability, and the provision of specific ecosystem services such as carbon sequestration or air purification. This process of leveraging generative algorithms to optimize environmental performance is referred to as generative optimization process.

Various example implementations are described herein with respect to the accompanying Figures.

FIG. 1 is a flow diagram of an example system architecture 100 for distribution based generative optimization according to example implementations of aspects of the present disclosure. In some instances, a user interacts with the described architecture by first defining a sample of the distribution of interest. This sample may be a collection of vector positions in cartesian space, an array of parameters describing the transformation of input objects, or any other data format.

The architecture 100 for this specific distribution-based generative optimization system includes the following: distribution 101, parameters 102, generative process 103, fitness function 104, result 105, target 106 (e.g., performance value), and optimizer 107. The distribution 101 can include a distribution of parameters 102 which parameterize the generative system. The distribution of parameters will be continually modified by the generative process. Additionally, the generative process 103 can include a system that translates parameter values to elements of the distribution modeled by the generative method.

Moreover, the fitness function 104 can include an explicit function that takes the distribution and associated parameters as an input and outputs a single value representing the optimality of the distribution. The output value of the fitness function can be the result 105. The target 106 can be the defined objective that indicates whether the result is approaching optimality.

Furthermore, the optimizer 107 can include an algorithm that evaluates the result 105 against the target 106 and determines how the distribution of parameters 102 for the generative process 103 should be modified to improve the result 105 of future iterations.

To target the generative optimization system towards the optimization of ecosystem parameters, the specified output (e.g., target 106) of the generative system can be in the context of an ecosystem. The result 105 can include the formation of a landscape or structures that alter the target 106 (e.g., distribution of sunlight, wind, and rain on a site, or the species of plants planted within an array of points on a landscape, or any other spatial distribution of designed elements that impact ecosystem parameters). The fitness function can determine the target 106 by modeling the predicted ecosystem performance metric, whether it be biodiversity on the site, carbon sequestration rates, runoff rates, air filtration, or others.

According to some embodiments, the procedural iterative process described above then runs as follows: the optimizer 107 can populate the distribution 101 with parameters 102. In some instances, the distribution 101 can be either procedurally translated into the architectural design (e.g., design, design construct) or parameterizing a generative method from which an architectural design is sampled. The architectural design is evaluated by the fitness function 104 through the application of simulation or models. The result 105 can be compared against the defined target 106. The optimizer 107 determines how to modify the distribution of parameters 102 to improve the results 105 of the procedural method of subsequent iterations. In case a generative model is used, the resulting new data is used to expand the distribution modeled by the generative model.

Furthermore, the system can effectively be adapted to a wide range of problems and design spaces. With the performance metric (e.g., target ecosystem parameter) being defined quantitatively and the parameter distribution can be procedurally translated into the design space of interest, generative optimization can be applied towards a desired solution.

In an example, such as the plant distribution for carbon sequestration scenario, the distribution based generative optimization can be targeted towards the maximization of carbon sequestration in a scenario where the system is selecting the species and position of plants for an empty field. In this scenario, the system has the ability to select plants from a roster and choose where the plants will be planted on the site. The system can have a database that includes information regarding each plant's needs with regards to sunlight, rain, companion plants, and soil type as well as their estimated carbon sequestration rate. The system can define a performance metric goal as maximizing the site's carbon sequestration rate. The system, in an iterative process as described in FIG. 1, can select a configuration of plants where each species is receiving adequate sunlight and rain and is planted in the appropriate soil next to appropriate companion plants, while skewing the selection towards plants that sequester the most carbon. The system can apply generative optimization in this scenario by defining the distribution 101 to be a fixed set of points in cartesian space with each point carrying a parameter 102 that defines the species of plant at its location. Each iteration, the system 100 can populate the distribution 101 with a parameter 102 that is associated with the plant species. A procedural model can then place representative geometries of the species on the site and conduct simulation to determine whether each plant receives enough sunlight and rain and is placed in appropriate soil. For example, the system can determine that a plant is placed in an inappropriate context, and the system 100 can remove the plant from the distribution. The fitness function 104 can then estimate the site's carbon sequestration rate with the target 106 set as a maximal increase of the result 105. The optimizer 107 can then examine the degree to which the result 105 increased and update one or more parameters 102 of the distribution 101 accordingly. After sufficient iterations, the system can output an architectural design (e.g., a distribution of plants in which each plant is placed in a specific location in the site) associated with the optimization of the target 106 (e.g., carbon sequestration approaches a maximum).

In another example, such as the structure design for natural light maximization scenario, the position-based generative optimization can be applied towards the maximization of natural daylight in a structure being designed by the system. In this scenario, the distribution 101 can be defined as vectors in cartesian space that define the boundary of a structure, or the centroid, rotation and translation of structural elements. The fitness function 104 can define the target 106 as the maximization of daylight hours observed from each position on the structure's exterior, which can be modeled via simulation. In this scenario, the system can work with a landscape populated by trees that shade specific areas and may not intersect with the structure, and the system can define a penalty to the result if any design intersects with existing trees. Each iteration, the distribution 101 can be populated by the system 100 and then generated by the generated process 103 into a three-dimensional model representing the structure. The fitness function 104 can first evaluate the number of daylight hours experienced annually across the structure's exterior and then check whether the structure intersects with any existing trees and penalize the resulting value accordingly. The target 106 can be the maximization of the resulting value, and iteration and regeneration of points would proceed accordingly.

In yet another example, such as the master planning for passive cooling scenario, the position-based generative optimization can be applied towards the maximization of passive cooling (or the minimization of fuel used to cool a set of structures). This scenario assumes that the system has the ability to define the placement and orientation of structures on a site as well as the placement of trees around said structures. The system 100 can aim to maximize the degree to which trees shade the structures and to which wind provides passive cooling that would reduce the need for energy expenditure on air conditioning in each structure. In this scenario, the distribution 101 would be an array of categorical parameters defining whether a section of the site is populated by structure, trees, or stays unpopulated. The generative process 103 can translate these parameters into a physical model of the site with its structures and trees. Additional steps could be used by the system 100 to link structures together with pathways or provide additional features such as parking space. The fitness function 104 can then simulate annual shading and average wind on the site and use the output of these models to estimate the surface temperature of each structure. The target 106 can be the minimization of this surface temperature. Over time, the optimizer 107 can learn to populate the site in arrangements that maximize the shading of structures with trees and that channel wind to maximize passive cooling.

Figure 2:
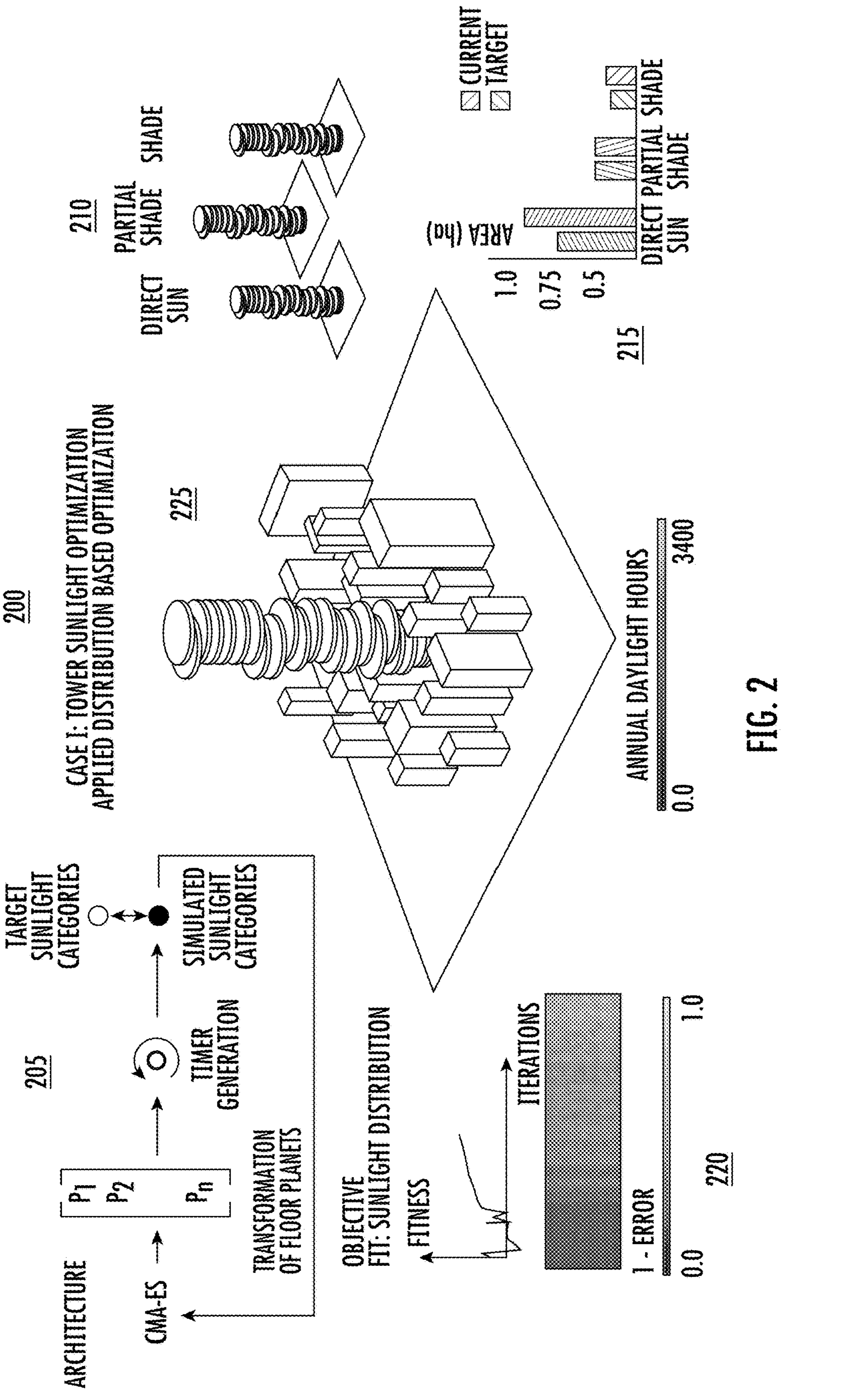
FIG. 2 is an illustration of a tower sunlight optimization case according to example implementations of aspects of the present disclosure.

FIG. 2 is an illustration of a tower sunlight optimization example 200 according to example implementations of aspects of the present disclosure. As previously described the structure design for natural light maximization scenario, the system 205 (e.g., system 100) can generate a building design that optimizes for the amount of sunlight. In this example 200, the distribution can be defined as vectors in cartesian space that define the boundary of a structure 210. The fitness function can define a plurality of targets 215 (e.g., full sunlight, partial sunlight, shade) to optimize for. In this example 200, the system can receive as an input a threshold value for each of the targets in the plurality of targets. For example, a user may want a minimum amount of the building to have full sunlight, so the result (e.g., architectural design of the building) should have an amount of sunlight that exceeds this threshold value. The system 205 can, in an iterative process as shown by the graph 220, update the architectural design 225 to maximize the amount of daylight hours observed from each position on the structure's exterior, which can be modeled via simulation. Each iteration, the architectural design 225 can be generated by the generated process into a three-dimensional model representing the structure. The fitness function can evaluate the number of daylight hours experienced annually across the structure's exterior, which can be presented in the graph 220 for each iteration. The target 215 can be the maximization of the resulting value, and iteration and regeneration of points would proceed accordingly.

Figure 3:
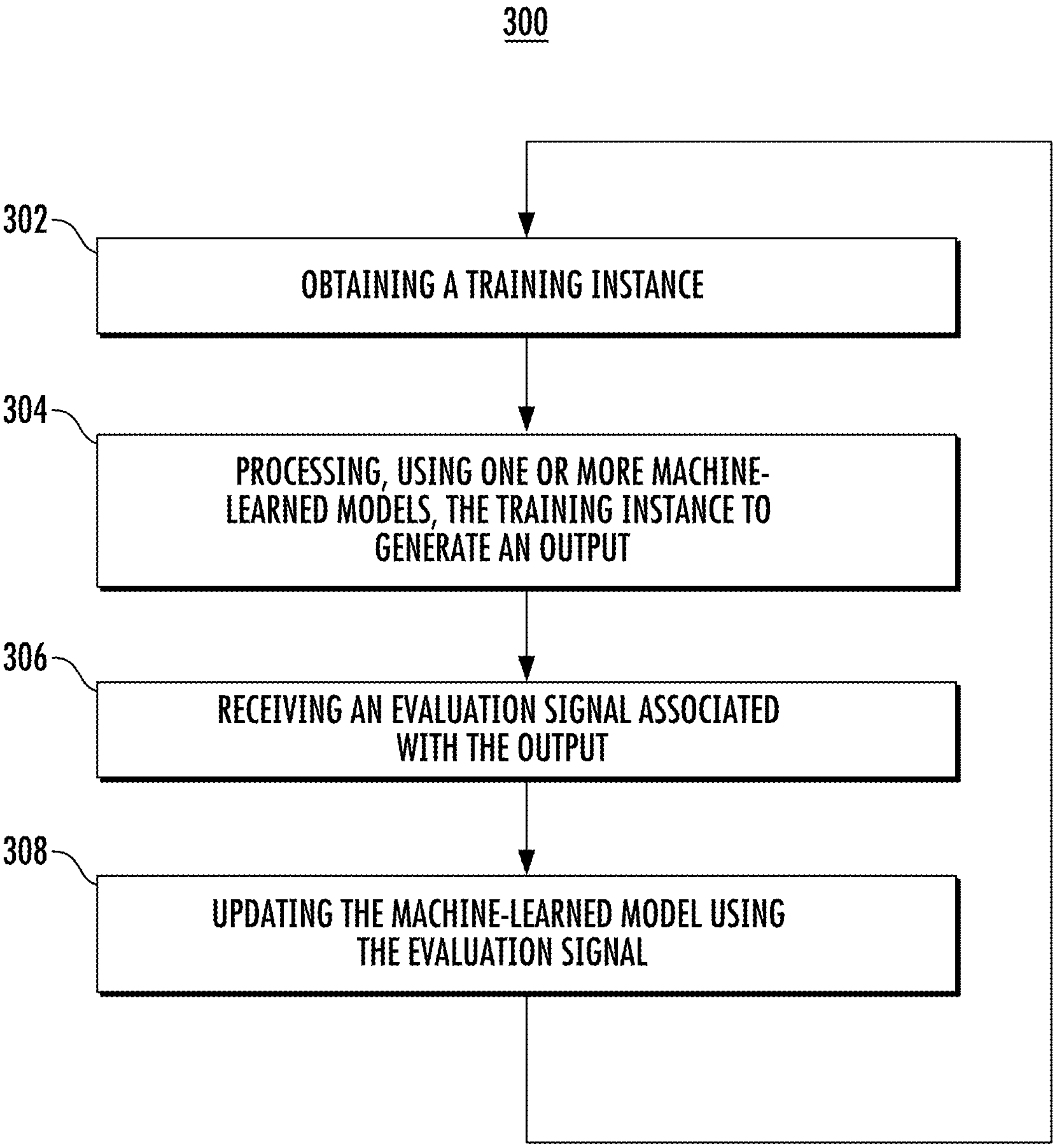
FIG. 3 is a flow chart diagram illustrating an example method for training a machine-learned model according to example implementations of aspects of the present disclosure.

FIG. 3 is a flow chart diagram illustrating an example method for training a machine-learned model according to example implementations of aspects of the present disclosure. For instance, an example machine-learned model can include a generative system to perform the generative process 103 in FIG. 1.

A computer can receive input(s). The computer can execute instructions to process the input(s) to generate output(s) using a parameterized model. The computer can obtain feedback on its performance in generating the outputs with the model. The computer can generate feedback by evaluating its performance. The computer can receive feedback from an external source. The computer can update parameters of the model based on the feedback to improve its performance. In this manner, the computer can iteratively "learn" to generate the desired outputs. The resulting model is often referred to as a machine-learned model.

One or more portion(s) of example method 300 can be implemented by a computing system that includes one or more computing devices such as, for example, computing systems described with reference to the other figures. Each respective portion of example method 300 can be performed by any (or any combination) of one or more computing devices. Moreover, one or more portion(s) of example method 300 can be implemented on the hardware components of the device(s) described herein, for example, to train one or more systems or models. FIG. 3 depicts elements performed in a particular order for purposes of illustration and discussion. Those of ordinary skill in the art, using the disclosures provided herein, will understand that the elements of any of the methods discussed herein can be adapted, rearranged, expanded, omitted, combined, or modified in various ways without deviating from the scope of the present disclosure. FIG. 3 is described with reference to elements/terms described with respect to other systems and figures for exemplary illustrated purposes and is not meant to be limiting. One or more portions of example method 300 can be performed additionally, or alternatively, by other systems.

At 302, example method 300 can include obtaining a training instance. A set of training data can include a plurality of training instances divided between multiple datasets (e.g., a training dataset, a validation dataset, or testing dataset). A training instance can be labeled or unlabeled. Although referred to in example method 300 as a 'training' instance, it is to be understood that runtime inferences can form training instances when a model is trained using an evaluation of the model's performance on that runtime instance (e.g., online training/learning). Example data types for the training instance and various tasks associated therewith are described throughout the present disclosure.

At 304, example method 300 can include processing, using one or more machine-learned models, the training instance to generate an output. The output can be directly obtained from the one or more machine-learned models or can be a downstream result of a chain of processing operations that includes an output of the one or more machine-learned models.

At 306, example method 300 can include receiving an evaluation signal associated with the output. The evaluation signal can be obtained using a loss function. Various determinations of loss can be used, such as mean squared error, likelihood loss, cross entropy loss, hinge loss, contrastive loss, or various other loss functions. The evaluation signal can be computed using known ground-truth labels (e.g., supervised learning), predicted or estimated labels (e.g., semi-, or self-supervised learning), or without labels (e.g., unsupervised learning). The evaluation signal can be a reward (e.g., for reinforcement learning). The reward can be computed using a machine-learned reward model configured to generate rewards based on output(s) received. The reward can be computed using feedback data describing human feedback on the output(s).

At 308, example method 300 can include updating the machine-learned model using the evaluation signal. For example, values for parameters of the machine-learned model(s) can be learned, in some embodiments, using various training or learning techniques, such as, for example, backwards propagation. For example, the evaluation signal can be backpropagated from the output (or another source of the evaluation signal) through the machine-learned model(s) to update one or more parameters of the model(s) (e.g., based on a gradient of the evaluation signal with respect to the parameter value(s)). For example, system(s) containing one or more machine-learned models can be trained in an end-to-end manner. Gradient descent techniques can be used to iteratively update the parameters over several training iterations. In some implementations, performing backwards propagation of errors can include performing truncated backpropagation through time. Example method 300 can include implementing several generalization techniques (e.g., weight decays, dropouts, etc.) to improve the generalization capability of the models being trained.

In some instances, the output of operation 308 can be the input of operation 302. For example, method 300 can be an interactive process, where the machine-learned model can be constantly updated based on additional training data.

In some implementations, example method 300 can be implemented for training a machine-learned model from an initialized state to a fully trained state (e.g., when the model exhibits a desired performance profile, such as based on accuracy, precision, recall, etc.).

In some implementations, example method 300 can be implemented for particular stages of a training procedure. For instance, in some implementations, example method 300 can be implemented for pre-training a machine-learned model. Pre-training can include, for instance, large-scale training over potentially noisy data to achieve a broad base of performance levels across a variety of tasks/data types.

In some implementations, example method 300 can be implemented for fine-tuning a machine-learned model. Fine-tuning can include, for instance, smaller-scale training on higher-quality (e.g., labeled, curated) data. Fine-tuning can affect all or a portion of the parameters of a machine-learned model. For example, various portions of the machine-learned model can be "frozen" for certain training stages. For example, parameters associated with an embedding space can be "frozen" during fine-tuning (e.g., to retain information learned from a broader domain(s) than present in the fine-tuning dataset(s)). In some implementations, example method 300 uses adapter modules. Adapters can be small trainable layers that are inserted between pre-existing layers of a pre-trained model. During the fine-tuning process, the original parameters of the pre-trained model are typically frozen, and only the parameters of the adapters are updated.

In some implementations, example method 300 can be implemented to execute parameter-efficient fine-tuning methods, such as Layerwise Optimization of Residuals (LoRA). LoRA can refine pre-trained models with minimal adjustments to the original parameters. This can be achieved by introducing trainable low-rank matrices that modify the behavior of the pre-trained weights without directly altering them. In some implementations, during fine-tuning, only these auxiliary matrices are updated, which significantly reduces the number of parameters that are trained.

Distribution Based Optimization

Figure 4:
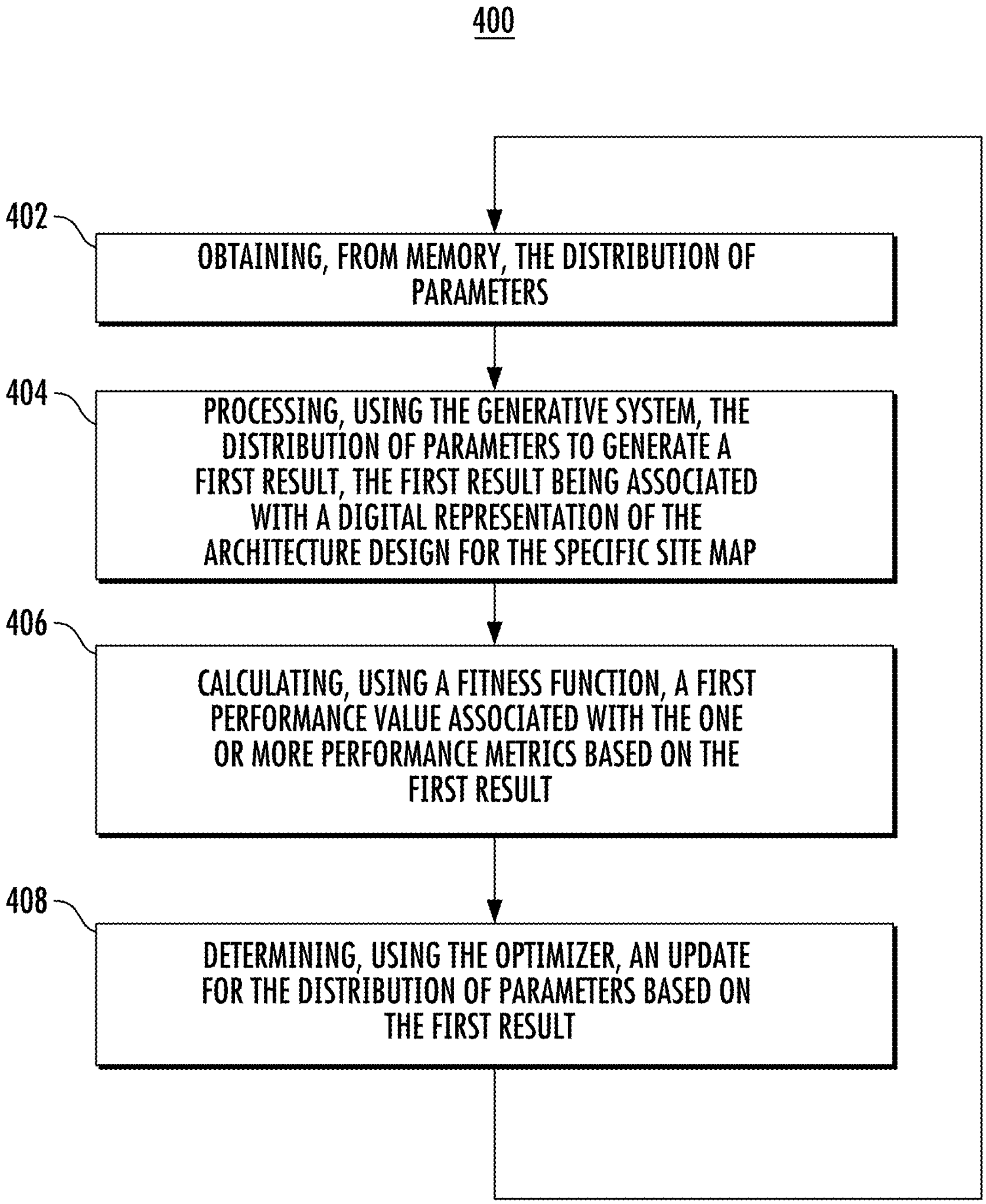
FIG. 4 is a flow chart diagram illustrating an example method for generating an architectural design using a distribution based generative optimization according to example implementations of aspects of the present disclosure.

FIG. 4 is a flow chart diagram illustrating an example method for generating an architectural design according to example implementations of aspects of the present disclosure.

According to some embodiments, the computing system can perform method 400 for generating an architectural design for a site map. The system can include one or more processors, and one or more non-transitory computer-readable media that collectively store: a generative system and an optimizer.

The generative system can be configured to process a distribution of parameters to generate a result for the site map. In some instances, the generative system is a combination of a procedural system and a machine-learned model. In some instances, the generative system is a diffusion model.

The optimizer can be configured to determine an update for the distribution of parameters to optimize for one or more performance metrics. In some instances, the optimizer is a natural evolution strategy optimization algorithm. In some instances, the optimizer is a stochastic neural architecture search (SNAS) algorithm.

In some instances, the system can obtain a mesh representation of the site map. Additionally, the system can train the generative system using the mesh representation of the site map.

At 402, the system can obtain, from memory, the distribution of parameters. The parameters 102 in FIG. 1 is an example of the distribution of parameters.

The distribution of parameters can be determined in a iterative process until the system has determined an optimal set of parameters that yields the highest performance according to the specified criteria. Moreover, the parameters can be inputted into the system to generate a result associated with an architectural design for the site based on a performance value. The performance value can be biodiversity on the site, amount of sunlight, carbon sequestration rates, runoff rates, and/or air filtration).

In some instances, for architectural design and space planning, the parameters can include building layout information, considering factors such as spatial efficiency, natural lighting, and energy consumption. Additionally, the parameters can include design rules, human preferences, and building regulations. Moreover, the parameters can include the shape and topology of structural and performative elements such as beams, columns, trusses, heating and cooling systems, glazing, and insulation. Furthermore, the parameters can include material usage, material weight, structural requirements, and/or performance needs.

In some instances, for urban planning and transportation design, the parameters can include placement of public facilities, land use, and transportation networks to enable the development of smart and sustainable urban environments. Additionally, the parameters can include traffic congestion data, environmental impact assessment data, and/or quality of life data.

In some instances, the parameters can include possible material compositions, so that the system can identify the optimal material for a given application, such as a lightweight structure, energy-efficient building, or high-strength component. The system can receive objectives, such as maximizing strength and durability, minimizing weight and cost, or finding the optimal balance between these properties. Additionally, the parameters can include manufacturing capabilities, environmental impact, and/or regulatory requirements.

In some instances, the distribution of parameters is a parameterized distribution function. For example, the parameterized distribution function can be generated using a Gaussian algorithm. Additionally, in one example, two parameters of the distribution of parameters are controlled by the Gaussian algorithm.

At 404, the system can process, using the generative system, the distribution of parameters to generate a first result. The generative system can include the generative process 103 described in FIG. 1. The first result can be associated with a digital representation of the architectural design for the specific site map. The result 105 in FIG. 1 is an example of the first result described at operation 404. The architectural design 225 in FIG. 2 is an example of the architectural design for the specific site map that is described at operation 404.

The generative system can include machine-learned models. In some instances, the machine-learned model can include Policy Gradients with Parameter-Based Exploration (PGPE) algorithm, Separable Natural Evolution Strategy (SNES) algorithm, Coronal Mass Ejections (CMEs) algorithm, CoOperative SYnapse NEuroevolution (COSYNE) algorithm, and/or Genetic algorithms (GA).

In some instances, the architectural design can be a landscape topology for the site map.

In some instances, the architectural design is a building design of a building to be constructed on the site map.

At 406, the system can calculate, using a fitness function, a first performance value associated with the one or more performance metrics based on the first result. The fitness function 104 in FIG. 1 is an example of the fitness function described at operation 406. The target 106 in FIG. 1 is an example of the first performance value.

In some instances, the one or more performance metrics include an amount of sunlight on an object on the site map, carbon sequestration value of the site map, surface temperature of an object on the site map, or water retention associated with the site map.

In some instances, the operations can further include processing, using the fitness function, the first result and historical environmental data to calculate the first performance value. The historical environmental data can have wind data and sunlight data for the site map.

At 408, the system can determine, using the optimizer, an update for the distribution of parameters based on the first result. The optimizer 107 in FIG. 1 is an example of the optimizer described in operation 408. As described in FIG. 1, the optimizer 107 can update one or more parameters 102 in the distribution 101.

Additionally, the generative systems for policy optimization can include: proximal policy optimization (PPO), trust region policy optimization (TRPO), soft actor critic (SAC); and/or conservative offline model COM based reinforcement learning.

In some instances, the output of operation 408 can be the input of operation 402. For example, method 400 can be an interactive process, where the system generates a result by processing the distribution of parameters, calculates a performance value, updates the distribution of parameters, and repeats the process until the performance value is optimized and/or exceeds a threshold value.

In some instances, the operations can further include obtaining, from a user device, a targeted performance metric. The update for the distribution of parameters can be further based on the targeted performance metric.

In some instances, the update for the distribution of parameters can be further based on the first performance value.

In some instances, the operations can further include generating, based on the first result, the digital representation of the architectural design. Additionally, the operations can include causing a presentation, on a user device, the digital representation of the architectural design when the first performance value exceeds a threshold value.

In some instances, the operations can further include storing, in memory, the distribution of parameters. The update to the distribution of parameters can include a modification to at least one parameter in the distribution of parameters. Subsequently, in the next iteration, the system can obtain the distribution of parameters from the memory as described in operation 402.

In some instances, the operations can include, for a plurality of iterations until an updated performance value exceeds a threshold value, obtaining, from memory, the distribution of parameters. Additionally, the operations can include processing, using the generative system, the distribution of parameters to generate an updated result, the updated result being an updated digital representation of the architectural design for the specific site map. Moreover, the operations can include calculating, using the fitness function, the updated performance value associated with the one or more performance metrics based on the updated result. Subsequently, the operations can include determining, using the optimizer, an update for the distribution of parameters based on the updated result.

In some instances, the operations can further include processing, using the optimizer, the first result to generate a second distribution of parameters. Additionally, the operations can include processing, using the generative system, the second distribution of parameters to generate a second result. Moreover, the operations can include calculating, using the fitness function, a second performance value associated with the one or more performance metrics based on the second result. Furthermore, the operations can include performing an action based on a comparison of the performance value and the second performance value.

Neural Field Based Optimization

According to some embodiments, the generative optimization techniques can optimize the neural fields directly. Neural fields can be implicit representations that translate arbitrary sized inputs into arbitrarily sized outputs. As the inputs and/or outputs are defined by neural networks, these functions can be trained when given appropriate training data and then deployed rapidly in new contexts. Neural fields can flexibly define surfaces, three-dimensional objects, or even temporal distributions, making them an ideal candidate for generative systems.

In some instances, the generative-optimization system can be targeted towards the optimization of ecosystem parameters. The system can be flexibly adapted for the design of landscapes, structures, master plans, or specific aspects of each such as the distribution of species on a site or architectural facade. When coupled with environmental simulations that model the distribution of sunlight, wind, and rain, the generative optimization system can be targeted towards the maximization of specific ecosystem services.

With regards to general utility, a novel application of the described machine learning architecture can enable the optimization of generative distributions towards specific ecosystem parameters. This approach describes an environment to the generative process such that the optimal object of design emerges by modeling the distribution or modifying a distribution to fit to that environment.

Figure 5:
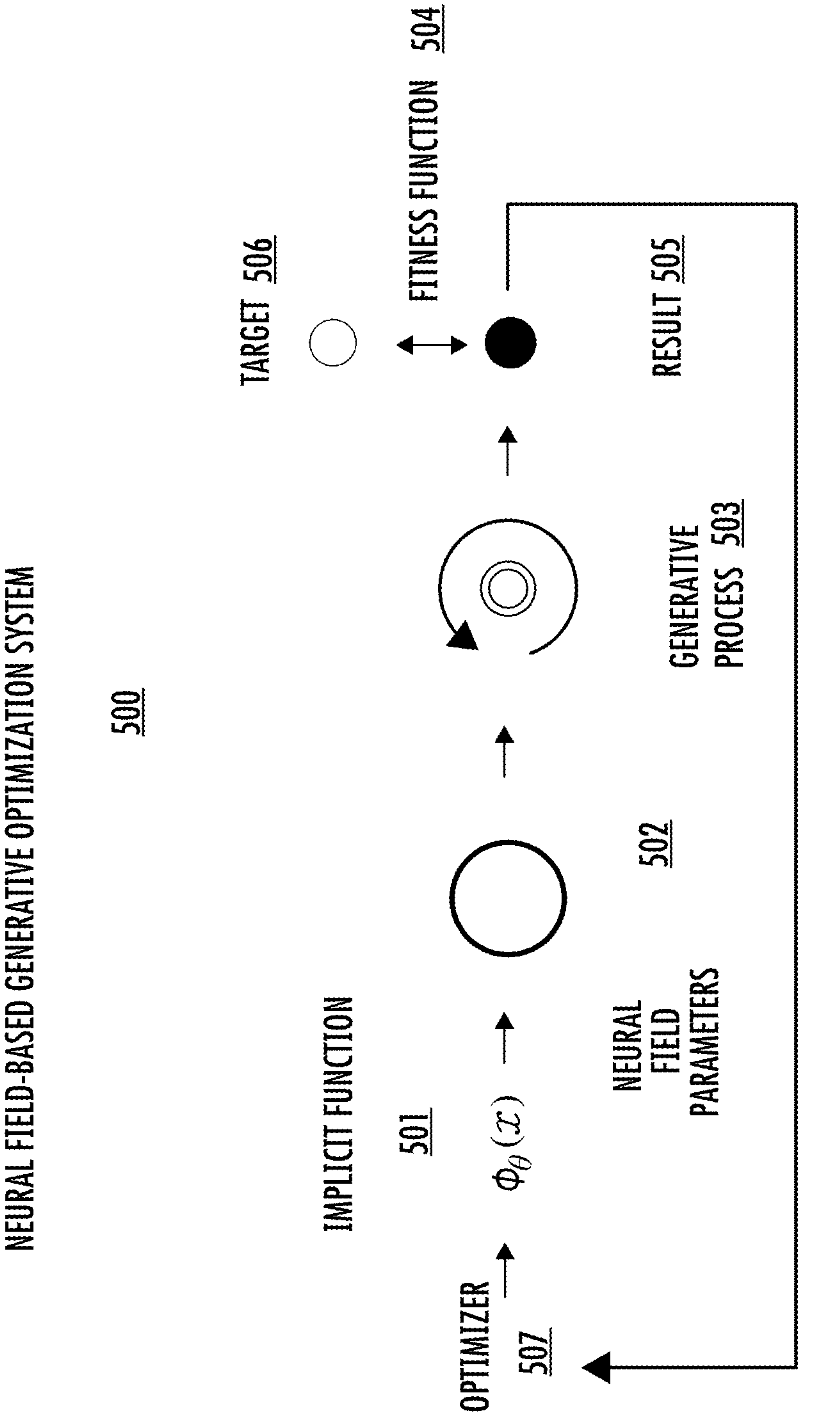
FIG. 5 is a flow diagram of an example system architecture for neural field based generative optimization according to example implementations of aspects of the present disclosure.

FIG. 5 is a flow diagram of an example system architecture 500 for neural field-based generative optimization system according to example implementations of aspects of the present disclosure. In some instances, a user interacts with the described architecture by first defining a sample of the distribution of interest. This sample may be a collection of vector positions in cartesian space, an array of parameters describing the transformation of input objects, or any other data format.

The architecture 500 for neural field-based generative optimization system includes the following: implicit function 501, neural field parameters 502, generative process 503, fitness function 504, result 505, target 506, and optimizer 507.

The implicit function 501 can include a neural network that receives inputs of arbitrary dimensions and outputs the field 502 of arbitrary dimensions. The generative process 503 includes a system that translates the output field of the neural implicit function to elements of the distribution modeled by the generative method. The fitness function 504 can include an explicit function that takes the distribution and associated parameters as an input and outputs a single value representing the optimality of the distribution. The result 505 can include the output value of the fitness function 504. The target 506 can include the defined objective that indicates whether the result 505 is approaching optimality. The optimizer 507 can include a method or a machine-learned model that evaluates the result 505 against target 506 and determines how the distribution of neural field parameters 502 can be modified in order to improve the result 505 of future iterations.

In some instances, a user can interact with the architecture 500 by first defining a sample of the distribution representative of the intended output field. This sample may be a collection of vector positions in cartesian space, an array of parameters describing the transformation of input objects, or any other data format.

Additionally, to target the generative optimization system towards the optimization of ecosystem parameters, the result 505 of the generative system can be in the context of an ecosystem. For example, the result 505 include the formation of a landscape or structures that alter the distribution of sunlight, wind, and rain on a site, or the species of plants planted within an array of points on a landscape, or any other spatial distribution of designed elements that impact ecosystem parameters. Subsequently, the fitness function 504 can model the predicted ecosystem parameter of interest, whether it be biodiversity on the site, carbon sequestration rates, runoff rates, air filtration, or others.

Furthermore, the procedural iterative process described above can continue with the optimizer 507 defining the parameters of the implicit function 501. The implicit function can generate the neural field parameters 502. The neural field parameters 502 is either procedurally translated into the architectural design or parameterizing a generative method from which a design is sampled. The architectural design can be evaluated by the fitness function 504 through the application of simulation or models. The result 505 can be compared against the defined target 506. Subsequently, the optimizer 507 can determine how to modify the distribution of neural field parameters 502 such that it would improve the result 505 of the procedural method in subsequent iterations. In case a generative model is used, The resulting new data is used to expand the distribution modeled by the generative model.

The neural field-based generative optimization system can effectively be adapted to a wide range of problems and design spaces. By being able to quantitatively describe the target 506 (e.g., target ecosystem parameter) and the result 505 (e.g., architectural design) can be described in the format of a field, generative optimization can be applied towards a desired solution.

By performing a simplification of the problem space, the system can be optimized so that each iteration can be run rapidly and therefore a large number of procedurally generated artifacts can be explored and optimized.

Additionally, the quantification of design intent is needed for optimization to take place. The system can quantify physical boundaries so that the optimizer can learn to create models that exist within them.

Furthermore, implicit representations or objects and surfaces can be quite cumbersome, especially when the object of interest is highly detailed and complex. In such scenarios, discrete representations such as manifold mesh surfaces can be modified more easily than an implicit function. Neural fields carry the advantage of being able to be flexibly adapted to a very wide range of contexts, easily accommodating surfaces, three-dimensional objects, and/or temporal changes of state. Furthermore, the indirect encoding of the neural implicit function may allow the optimizer to find solutions that are better than given by a direct encoding. Additionally, as they are neural networks, neural fields can be trained to learn specific representations that can be deployed later.

The system can learn how to apply generative optimization towards their design space. Using transfer learning, the system can flexibly adapt generative process 503 and the optimizer 507 towards a broad range of problems and rapidly generate far more designs than could be created by traditional workflows. Most importantly, the system can quantify the impact of said designs on ecosystem parameters.

In the solar panel orientation for maximal sunlight exposure scenario, the neural-field based generative optimization can be targeted towards the maximization of sunlight exposure on a random topology populated with thousands of solar panels. In this scenario, the system can have the ability to define the position and orientation of each individual solar panel. Determining the optimal fixed orientation of each solar panel by hand would prove impossible, and defining the position and orientation of each panel in cartesian space would rapidly create too many parameters to be optimized efficiently by conventional means. Furthermore, the placement of each panel impacts the amount of sun experienced by adjacent panels due to shading, making the problem particularly challenging to solve in a stepwise fashion. Using neural-field based generative optimization, the system can construct a spatial field in the form of the terrain on which the panels are distributed, and then have the field define the density of solar panels and their orientation. The implicit function can receive an input of a set of vectors in cartesian space and output a density field with embedded orientations, onto which the solar panels could be distributed and oriented. The density field with embedded orientations can represent a significant reduction in the parameter space. The fitness function can be defined as the amount of direct sunlight experienced by each panel annually as determined via simulation with a target set to maximize the amount of direct sunlight value. Over time, the system can output a field that defines the density and orientation of solar panels at any surveyed point, allowing the system to rapidly approach an optimal configuration.

In the landscape design for biodiversity maximization scenario, neural field based generative design can be applied by the system to maximize the biodiversity of a planted distribution on a fixed landscape. In this scenario, the system obtain a fixed set of local species and determine a design that optimize for a biodiverse distribution possible while ensuring that each species is planted next to others that thrives with and receive enough sunlight and rain to survive. In this scenario, the neural field can define a categorical distribution over space representing the species being worked with, with each value representing the probability that the species will be present at the surveyed location. A fitness function can be defined as the calculated biodiversity of the plot with penalties assigned for plants that do not receive enough sunlight or rain or are planted next to inappropriate companions. Over iterations, the optimizer can weigh the neural field to maximize biodiversity while minimizing the placement of plants in inappropriate contexts, leading to a resilient, biodiverse distribution that can be planted. The system can backpropagate the neural network and train it during the optimization process, the system can then be able to apply the trained network in new contexts to immediately generate optimized biodiverse distributions for other sites.

Figure 6:
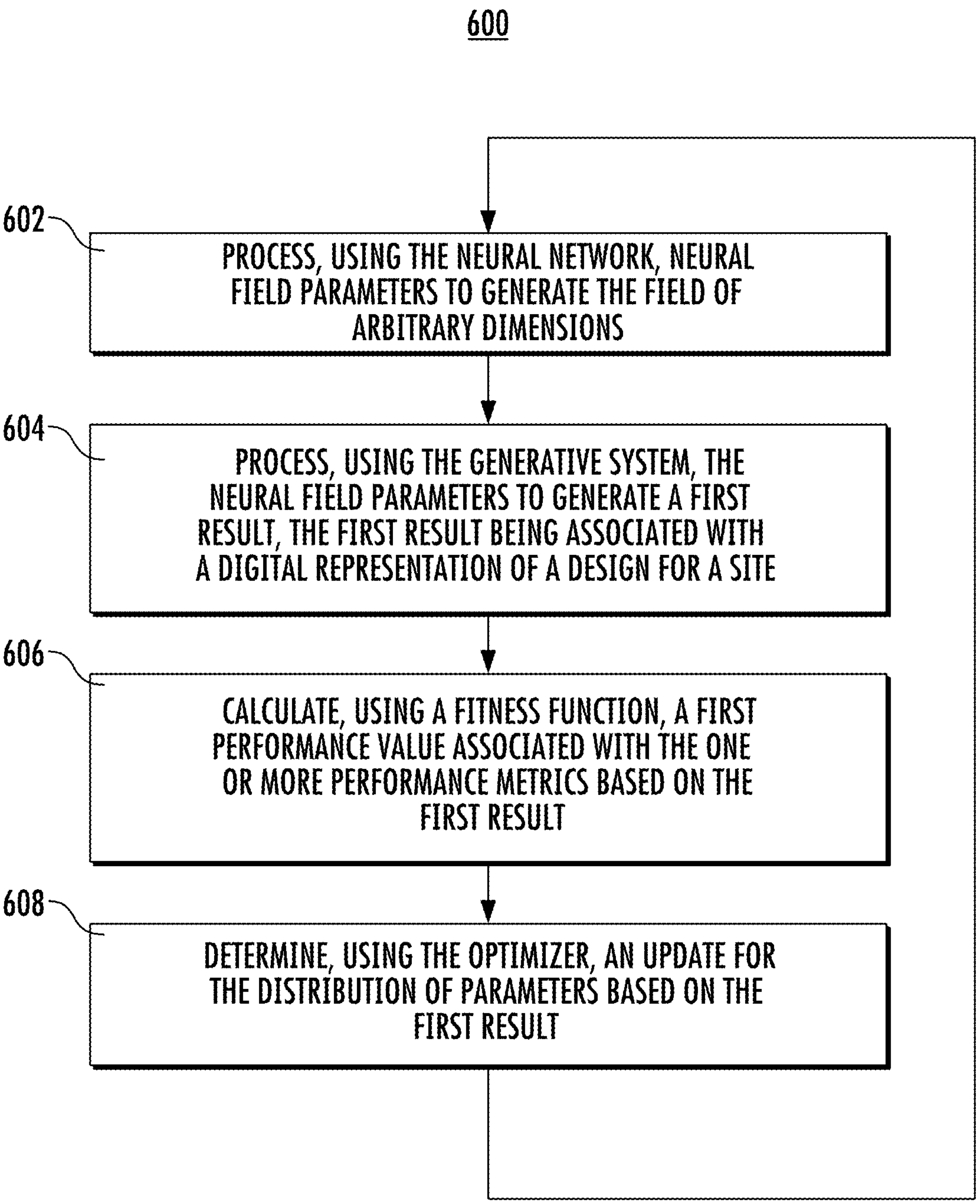
FIG. 6 is a flow chart diagram illustrating an example method for generating a design using a neural field based optimization according to example implementations of aspects of the present disclosure.

FIG. 6 is a flow chart diagram illustrating an example method for generating an architectural design according to example implementations of aspects of the present disclosure.

According to some embodiments, the computing system can perform method 600 for generating an architectural design for a site map. The system can include one or more processors, and one or more non-transitory computer-readable media that collectively store: a generative system and an optimizer.

The generative system can be configured to process a distribution of parameters to generate a result for the site map. In some instances, the generative system is a combination of a procedural system and a machine-learned model. In some instances, the generative system is a diffusion model.

The optimizer can be configured to determine an update for the distribution of parameters to optimize for one or more performance metrics. In some instances, the optimizer is a natural evolution strategy optimization algorithm. In some instances, the optimizer is a stochastic neural architecture search (SNAS) algorithm.

In some instances, the system can obtain a mesh representation of the site map. Additionally, the system can train the generative system using the mesh representation of the site map.

In some instances, the system can further receive user input, the user input defining a sample of the distribution representative of the intended output field.

At 602, the system can process, using the neural network, the neural field parameters to generate the field of arbitrary dimensions.

In some instances, the neural network is an implicit function that receives inputs of arbitrary dimensions.

In some instances, the neural field parameters include a set of vector positions in a cartesian space.

In some instances, the neural field parameters include an array of parameters describing a transformation of input objects.

At 604, the system can process, using the generative system, the neural field parameters to generate a first result, the first result being associated with a digital representation of the design for the site.

In some instances, the first result is a distribution associated with the neural field parameters.

In some instances, the result include a formation of a landscape.

In some instances, the result include a structure that alter the distribution of sunlight, wind, and rain on a site.

In some instances, the result includes a species of plants planted within an array of points on a landscape.

In some instances, the result includes a spatial distribution of designed elements that impact ecosystem parameters.

At 606, the system can calculate, using a fitness function, a first performance value associated with the one or more performance metrics based on the first result.

In some instances, the fitness function includes an explicit function that processes the first result to generate a single value representing an optimality of a distribution associated with the neural field parameters.

In some instances, the fitness function determines biodiversity value on the site or carbon sequestration rates for the site.

In some instances, the fitness function determines water runoff rates for the site In some instances, the fitness function determines air filtration associated with the site.

At 608, the system can determine, using the optimizer, an update for the distribution of parameters based on the first result.

In some instances, the optimizer evaluates the result against a target to determines how the neural field parameters can be modified in order to improve the result in a future iteration. For example, the target include a defined objective that indicates whether the result is approaching optimality.

In some instances, the system can further generate, using the neural network and the generative system, a second result for a second site based on a transfer learning technique.

In some instances, the result includes a location on the site and an angle position for each solar panels in a plurality of solar panels.

Diversity Search and Feature Illumination

The diversity search configuration of generative optimization can continuously optimize a set of outputs, instead of determining a single optimal output. By continuously optimizing the set of outputs, the system can populate a broad space to analyze how design decisions impact parameters of interest. The diversity search process (e.g., feature space illumination process) can produce a set of diverse outcomes rather than a single optimum. For example, the system can analyze how varying the amount of greenspace or blue space in a park impacts local temperatures with the goal of maximizing passive cooling in the design. Rather than returning a single, optimized layout for the park, the system can provide a set of different configurations with insight into how many different configurations each with different amounts of green and blue space perform.

Figure 7:
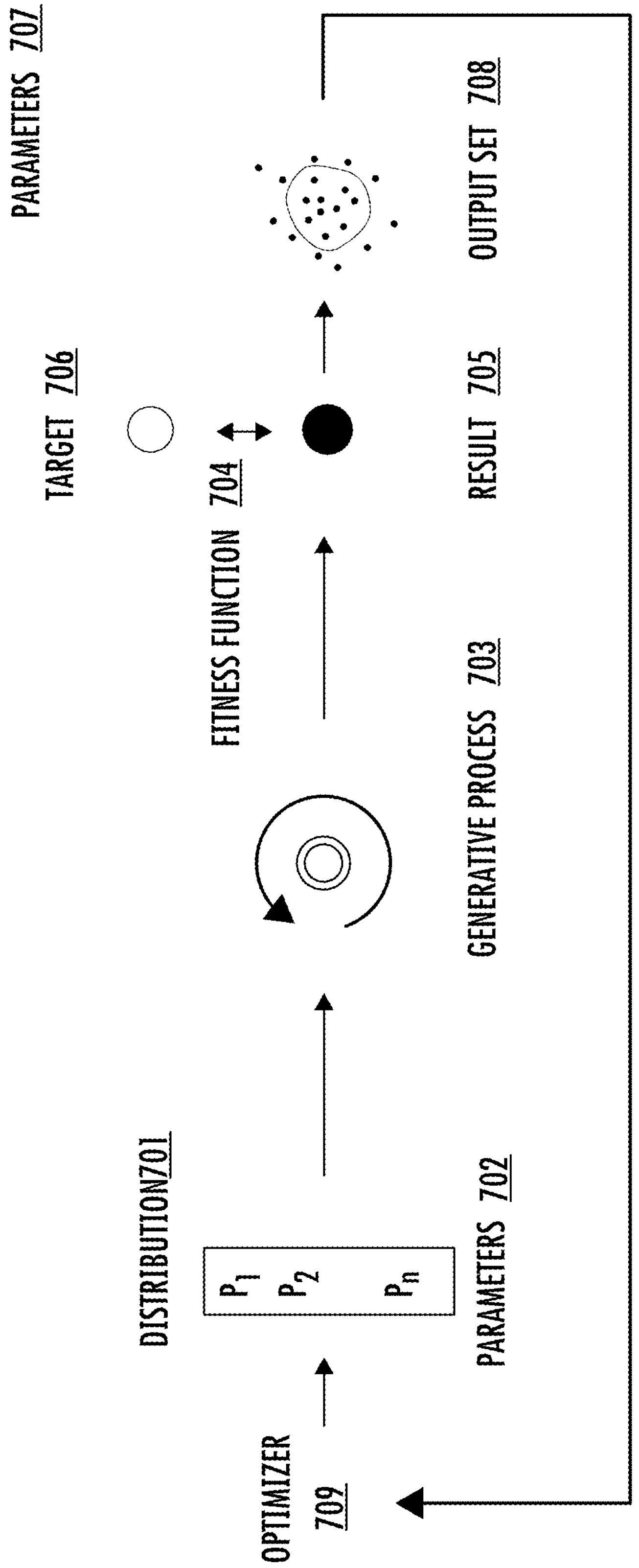
FIG. 7 is a flow diagram of an example system architecture diversity-search-field based generative optimization according to example implementations of aspects of the present disclosure.

FIG. 7 is a flow diagram of an example system architecture 700 of a system for diversity search field based generative optimization according to example implementations of aspects of the present disclosure.

The system can target generative-optimization process towards the optimization of ecosystem parameters. The system can be flexibly adapted for the design of landscapes, structures, master plans, or specific aspects of each such as the distribution of species on a site or architectural facade. When coupled with environmental simulations that model the distribution of sunlight, wind, and rain, the system can be targeted towards the maximization of specific ecosystem services.

The system enables the optimization of generative distributions towards specific ecosystem parameters. The system includes a generative process such that the optimal object of design emerges by modeling the distribution or modifying a distribution to fit that environment.

The system architecture 700 for this specific distribution-based generative optimization system includes a distribution 701 of parameters 702, a generative process 703, a fitness function 704, a result 705, a target 706, a diversification parameters 707, an output set 708, and an optimizer 709.

The distribution 701 can be a distribution of parameters 702 which parameterize the generative process 703 (e.g., generative system). The distribution of parameters can be continually modified by the generative process 703. The generative Process 703 can be a model or a system that translates parameter values to elements of the distribution modeled by the generative method. The fitness function 704 can be an explicit function that takes the distribution and associated parameters as an input and outputs a single value representing the optimality of the distribution. The result 705 can be an output value of the fitness function 704. The target 706 can be the defined objective that indicates whether the result 705 is approaching optimality. The diversification parameters 707 can be a subset of parameters for the optimizer 709 to explore the relationship between. The diversification parameters 707 can be received from a user. The diversification parameters 707 can be a direct subset of the distribution of parameters 702, or derived from the distribution of parameters 702, such as a translation of the distribution of parameters 702. The output set 708 can include a collection of outputs with their evaluated fitness and diversification parameters 707. The optimizer 709 can include a system (e.g., model, method, algorithm) that can evaluate the result 705 against the target 706 to determines how the distribution of parameters 702 for the generative process 703 can be modified in order to improve the result 705 of future iterations. For example, the optimizer 709 can sweep along the parameters of interest for each iteration.

According to some embodiments, a user can interact with the system architecture 700 by first defining a sample of the distribution of interest and their subset parameters of interest. This sample may be a collection of vector positions in cartesian space, an array of parameters describing the transformation of input objects, or any other data format.

To target the generative optimization system towards the optimization of ecosystem parameters, the specified output of the generative system can be in the context of an ecosystem. The context of the ecosystem can include the formation of a landscape or structures that alter the distribution of sunlight, wind, and rain on a site, or the species of plants planted within an array of points on a landscape, or any other spatial distribution of designed elements that impact ecosystem parameters. The fitness function can then model the predicted ecosystem parameter of interest, whether it be biodiversity on the site, carbon sequestration rates, runoff rates, air filtration, or others.

Additionally, the procedural iterative process described with the system architecture 700 can iteratively operate such that: the optimizer 709 defines the parameters 702 of the distribution 701. The distribution 701 can either procedurally translated into the result 705 (e.g., design context) or parameterizing a generative method from which a result 705 (e.g., a design) is sampled. The result (e.g., design context) can be evaluated by the fitness function 704 through the application of simulation or models. The result can be compared against the defined target 706 and added to the output set. The optimizer 709 can determine how to modify the distribution 701 to improve the result 705 of the procedural method of subsequent iterations subject to the limitation of trying to identify combinations of diver that have not yet been output. In case a generative model is used, The resulting new data is used to expand the distribution modeled by the generative model.

In some instances, the diversity search algorithm begins by generating a distribution of initial parameters randomly. Each parameter is translated through a generative or procedural method to an object in the design context and then evaluated to determine its performance and its position within a multi-dimensional feature space, where each dimension represents a different characteristic or feature of interest. The algorithm can populate the output set 708 or feature grid with the best-performing solutions for each combination of these features.

Once the initial archive is set, the algorithm can proceed to select from the feature grid or output set. In some instances, these selected parameters can undergo variation, for example, by adding a gaussian noise. The newly generated solutions are then again translated and evaluated to assess their performance and to determine their new positions in the output set.

After evaluation, the algorithm updates the output set by comparing the new solutions to the existing optimal solutions in their respective cells. If a new solution outperforms the current in a specific cell, it is replaced with the new solution. This cycle of selection, variation, evaluation, and archive updating is repeated for a predetermined number of iterations or until a specified stopping criterion is met.

The described system can effectively be adapted to a wide range of problems and design spaces. So long as the target ecosystem parameter can be described quantitatively and the parameter distribution can be procedurally translated into the design space of interest, generative optimization can be applied towards a desired solution.

In the diversity search for carbon negative master planning scenario, the diversity search based generative optimization can be used to explore the relationship between building and landscape elements on a site and the resulting carbon footprint of the site. This scenario assumes a designer has the ability to define the placement and orientation of structures on a site as well as the placement of trees around said structures. The system's aim can be to maximize the degree to which trees shade the structures and to which wind provides passive cooling that would reduce the need for energy expenditure on air conditioning in each structure. In this scenario, the distribution would be an array of categorical parameters defining whether a section of the site is populated by structure, trees, or stays unpopulated. A procedural model would translate these parameters into a physical model of the site with its structures and trees. Diversity parameters would be defined as the total amount of trees and the total amount of human structure. Additional steps could be used to link structures together with pathways or provide additional features such as parking space if the designer wished. The fitness function 704 can then simulate annual shading and average wind on the site and use the output of these models to estimate the surface temperature of each structure. This temperature would then be used to estimate the operational carbon emissions that the site would need to use to maintain room temperature indoors. The target 706 can be the minimization of the carbon budget. With the defined diversity parameters 707, the output set 708 can illustrate the relationship between the amount of tree space, the amount of human structures, and carbon footprint. From this, the system can then select the least carbon intensive arrangement with the appropriate amount of each parameter or simply develop a better intuition about the relationship between greenspace, human program, and energy budgets.

In the landscape design for cost effective flood mitigation scenario, the diversity search based generative optimization can conduct a cost-benefit analysis in a scenario where an urban planner is determining how best to use greenspace in order to mitigate flooding in a city. Because greenspace can absorb and retain more water than concrete, creating parks and greenspace buffers is an effective strategy for mitigating urban flooding. However, the development and maintenance of greenspace can be costly. In this scenario, the urban planner would wish to understand the relationship between the amount of greenspace they can create, the total cost, and the mitigation of flooding in their area of interest. The Distribution would constitute a set of categorical parameters defining whether a space in the site of interest is populated by permeable greenspace or impermeable structures. A number of elements would be fixed as existing structures that may not be modified by the generative process 703. A procedural model would translate this distribution into a three-dimensional model representing the designed urban space and then simulate runoff from heavy rainfall. The fitness function 704 can represent the severity of flooding with a target 706 set to minimize that severity, while diversification parameters 707 can estimate the cost of the design and the amount of greenspace. After sufficient iterations, the output set 708 can constitute a map that relates the cost and amount of greenspace to the effectiveness of flood mitigation, allowing the planner to either select the most feasible plan or provide detailed information to others.

Figure 8:
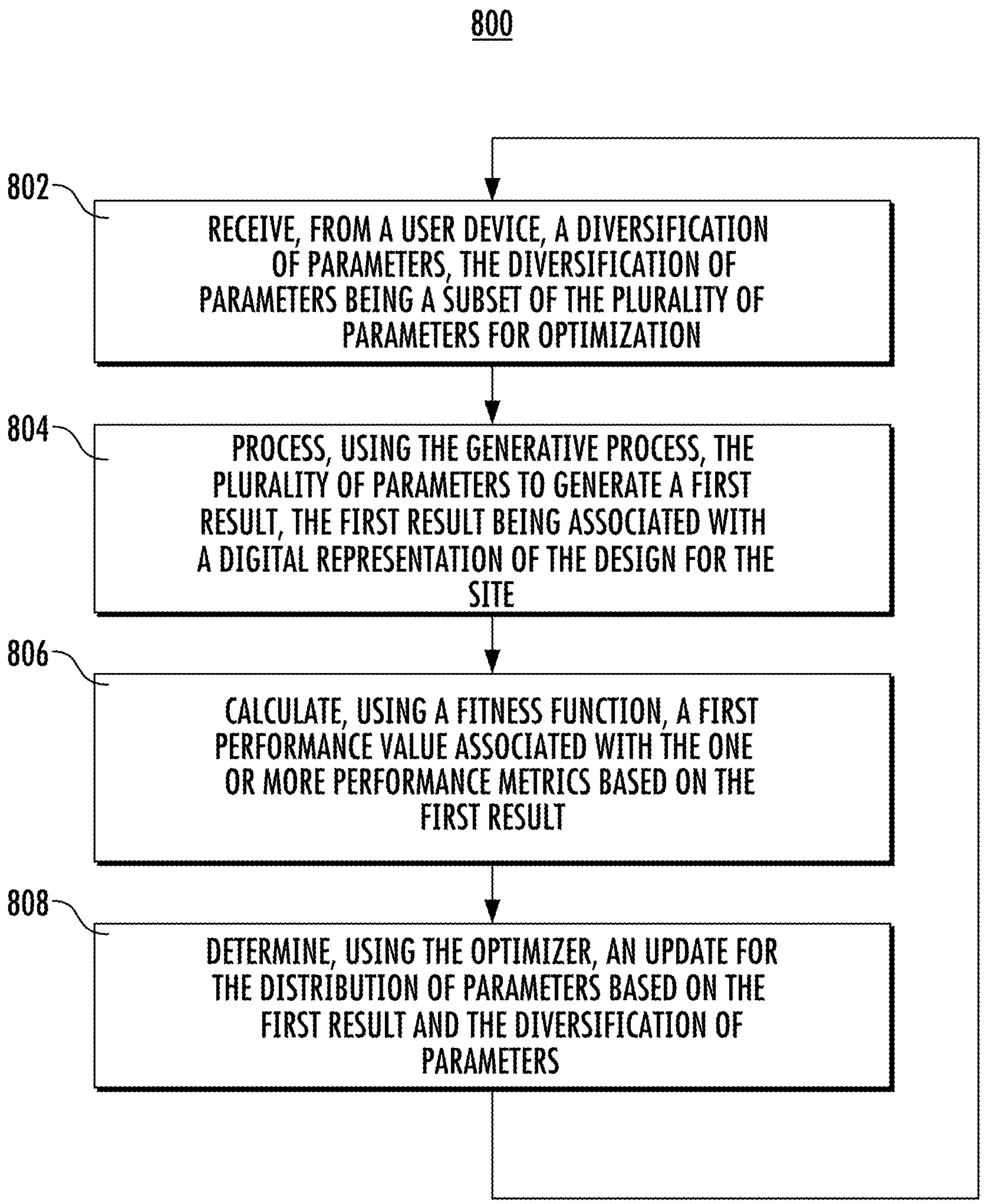
FIG. 8 is a flow diagram illustrating an example method for diversity-search-field based generative optimization according to example implementations of aspects of the present disclosure.

FIG. 8 is a flow diagram illustrating an example method for diversity-search-field based generative optimization according to example implementations of aspects of the present disclosure.

According to some embodiments, the computing system can perform method 800 for generating an architectural design for a site map. The system can include one or more processors, and one or more non-transitory computer-readable media that collectively store: a generative system and an optimizer.

The generative system can be configured to process a distribution of parameters to generate a result for the site map. In some instances, the generative system is a combination of a procedural system and a machine-learned model. In some instances, the generative system is a diffusion model.

The optimizer can be configured to determine an update for the distribution of parameters to optimize for one or more performance metrics. In some instances, the optimizer is a natural evolution strategy optimization algorithm. In some instances, the optimizer is a stochastic neural architecture search (SNAS) algorithm.

In some instances, the system can obtain a mesh representation of the site map. Additionally, the system can train the generative system using the mesh representation of the site map.

At 802, the system receive, from a user device, a diversification of parameters, the diversification of parameters being a subset of the plurality of parameters for optimization.

At 804, the system can process, using the generative process, the plurality of parameters to generate a first result, the first result being associated with a digital representation of the design for the site.

At 806, the system can calculate, using a fitness function, a first performance value associated with the one or more performance metrics based on the first result.

At 810, the system can determine, using the optimizer, an update for the distribution of parameters based on the first result and the diversification of parameters.

Reinforcement Learning Based Search

Design processes that directly shape landscapes, such as architecture, landscape architecture, and urban planning, have the potential to maximize the provision of these services with the system generating configurations, plans or programs that ensure the resilience and productivity of ecosystems on a site. The design workflow of the system allow a designer to model an ecosystem and then rapidly examine various configurations, behaviors and plans in a design space and predict the impact that each would have on the ecosystem parameters of interest. The system can learn what designs, plans or programs maximize said parameters and iteratively optimize and yield productive, resilient ecosystems.

In order to obtain an optimal design, the system can implement a generative optimization process where the generative system is controlled by a deep reinforcement learning algorithm. For example, the iterative generative process can be controlled by a policy that maps states to actions. In this context, states represent the current status of the generative process, including the current solution, partial solution and their attributes, while actions represent possible modifications or steps such as design decision or intermediate steps that can be applied to the current state to generate the next state in the process. The policy defines what action to take when the process is in a particular state and can be deterministic, specifying a specific action for each state, or stochastic, offering a probability distribution over actions for each state.

The system can utilize deep reinforcement learning to optimize the policy. Viewed in a reinforcement learning framework, the agent, which is the entity that learns to make decisions to control the generative process interacts with the generative process in order to maximize cumulative expected utility or reward. The generative process transitions from one state to another based on the agent's actions and provides feedback in the form of rewards, indicating the quality or performance of the generated outcome at each step. The reward may only be provided at the end of the iterative generative process or during each step of the generation process.

The system can be targeted to optimize ecosystem parameters. The system can be flexibly adapted for the iterative design of landscapes, plans for modifying distributions of vegetation, master plans that may change or adapt over time, the introduction of species on a site or architectural facade over time or the adaption of a dynamic building program to environmental conditions. When coupled with environmental simulations that model the distribution of sunlight, wind, and rain, and are incorporated to the reward structure, this generative optimization system can be targeted towards the maximization of specific ecosystem services.

Figure 9:
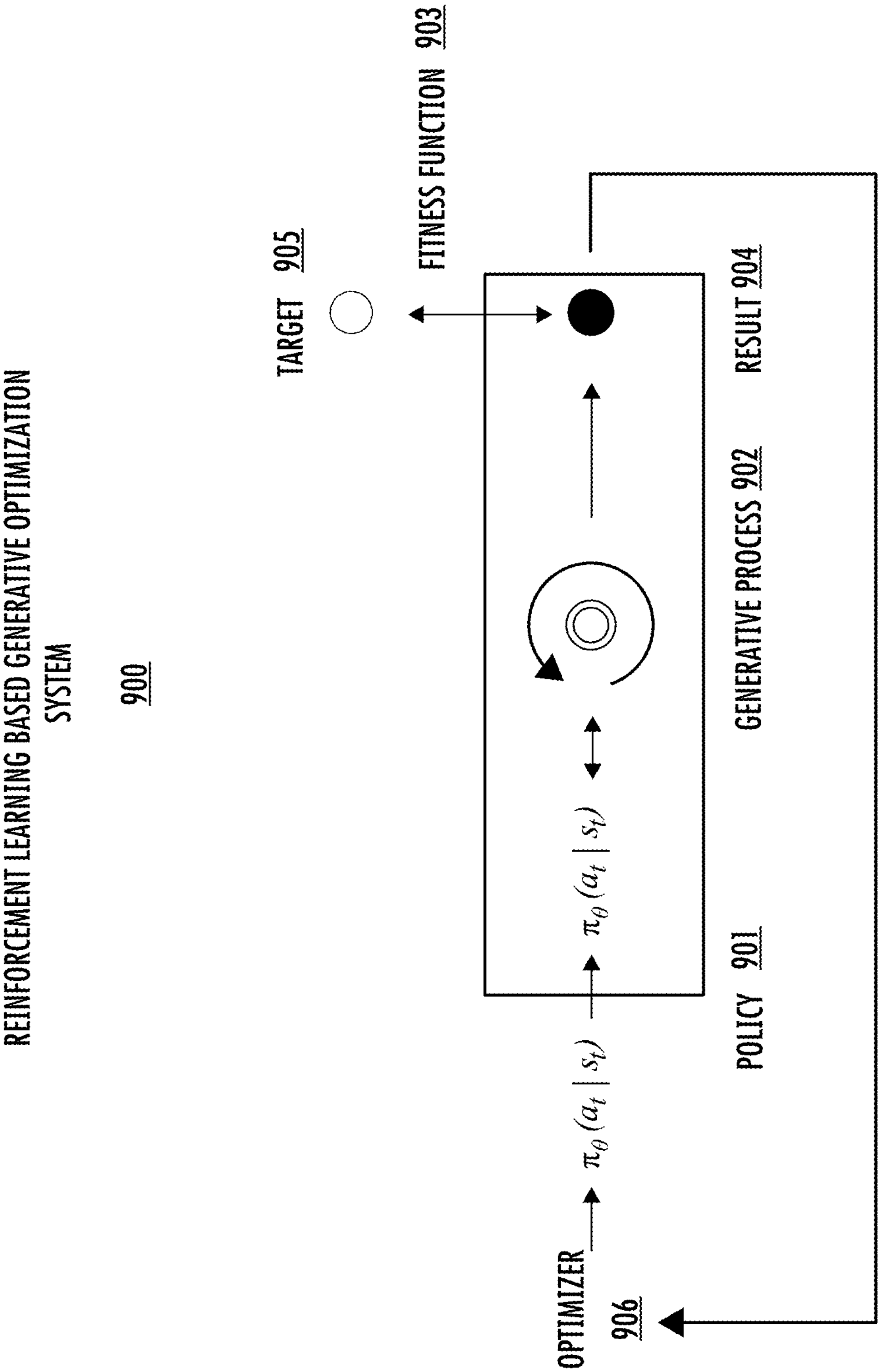
FIG. 9 is a flow diagram of an example system architecture of a system for reinforcement learning based generative optimization according to example implementations of aspects of the present disclosure.

FIG. 9 is a flow diagram of an example system architecture 900 of a system for reinforcement learning based generative optimization according to example implementations of aspects of the present disclosure.

The system architecture 900 can be a generative optimization system for ecosystem parameter optimization. The system can include a policy 902, which can be a function that relates states of the generative or procedural system to actions on that system. Additionally, the system can include a generative process 902 that generates an output over iterations using actions as a control signal. Moreover, the system can include a fitness function 903 that can be an explicit function that evaluates the utility, fitness or reward of the process or its iterations. The generative process 902 can output a result 904. The result 904 can be the output of the generative system either at the end of the iteration process or during the process. The target 905 can be the objective defined by a user indicating whether the result 904 is approaching optimality and used in the reward function. The system can include an optimizer 906, which can be machine-learned model that evaluates the result 904 and the target 905 to determines how the policy 901 can be modified to improve future iterations.

To target the generative optimization system towards the optimization of ecosystem parameters, the specified result 904 (e.g., output) of the generative system can be in the context of an ecosystem. The result 904 can be associated with the formation of a landscape or structures over time that alter the distribution of sunlight, wind, and rain on a site over time, or the programmed allocation of species of plants on a landscape, or any other spatial time-varying distribution of designed elements that impact ecosystem parameters. The fitness function 903 can then model the predicted ecosystem parameter of interest, whether it be biodiversity on the site, carbon sequestration rates, runoff rates, air filtration, or others.

Additionally, an iterative procedural or generative system that models the ecosystem parameters of interest can be defined. The structure of the policy controlling generation process of the generative system or procedural system can be defined. A target value or reward model can be defined. The optimization method creates a set of policies. The policies can be used in the generative process. The policy can receive a state of the generative system and outputs actions that: are iteratively procedurally translated into the design context; control an iterative procedural system with a particular end result in the design context; and/or influence the generation process of a generative method from which a design is sampled and used in the design context.

The design context can be evaluated by the fitness function 903 through ecosystem related simulations or models. The optimizer 906 can determine how to modify the policy to maximize the cumulative expected reward of subsequent runs. If a generative model is used, the resulting new data expands the distribution modeled by the generative model.

The described system can effectively be adapted to a wide range of problems and design spaces, as long as the target ecosystem parameter can be described quantitatively and the parameter distribution output by the policy can be procedurally translated into the design space of interest, generative optimization can be applied towards a desired solution.

In the landscape decontamination policy optimization scenario, the reinforcement learning based generative optimization can be used to optimize a policy for phytoremediation of contaminated soil. In phytoremediation scenarios, a designer can plant species that will sequester contaminants in the soil, making the site safe for other species such as humans. However, effective phytoremediation requires plants to be resilient and flourish as they decontaminate the soil. To create a thriving ecosystem that decontaminates effectively, a designer may need to iteratively introduce plants to a contaminated site based on their tolerance for the current level of contamination and the relationship between the introduced and existing plants. In this scenario, a landscape designer can have a list of plants that can populate on a contaminated site. Each plant has a specific tolerance for the contaminant concentration and thrive when it is placed next to appropriate companions who require similar pollinators and environmental conditions. The policy can constitute a function that takes in the site with its current species and level of contamination and outputs the next batch of plants to be introduced to the site. The fitness function can be the total decontamination rate of the site over time with the target being its minimization. Over many iterations, the optimizer can modify the policy until it can effectively examine the landscape at different states of contamination and plant introduction and effectively determine the best way to introduce more plants to further the decontamination process.

In the agent based modeling for structural optimization scenario, the reinforcement learning based generative optimization can be used to optimize the behaviors of an agent based model to create optimized structures. In this scenario, a designer can define the behaviors of an agent based model so that the agents are able to adapt to a context and define the bounds of a structure such as a suspension bridge, ensuring that it is supported in the appropriate areas while minimizing the material used in its construction. When successfully optimized, the policy can be deployed on any bridge geometry and construct optimal trusses. The policy in this instance can define the behaviors of digital agents that move independently and interact with one another. The movements of these agents in space over a fixed period of time would determine the geometry of the described network (e.g., truss network). The fitness function can then simulate gravity and determine whether the bridge is appropriately supported by the structure created by the agents. The target can minimize the minimization of material use while supporting the bridge against the forces of gravity. Over time, the optimizer can modify the policy until the agents learned to create an effective structure (e.g., truss-like structure) that minimized material and supported the bridge. The trained agents can then be able to adapt to new contexts, constructing effective trusses in new scenarios without retraining.

Figure 10:
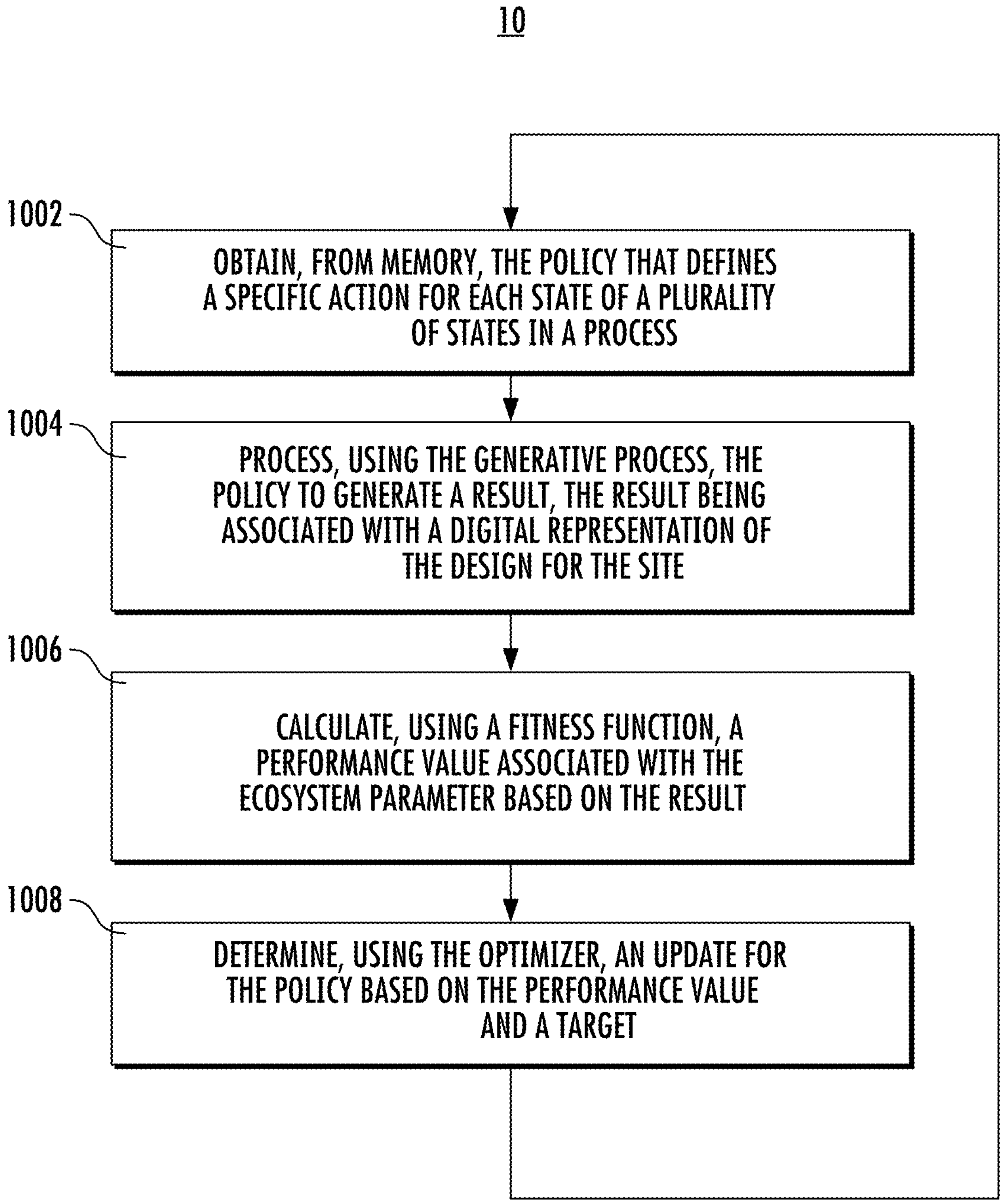
FIG. 10 is a flow diagram illustrating an example method for reinforcement learning based generative optimization according to example implementations of aspects of the present disclosure.

FIG. 10 is a flow diagram illustrating an example method for reinforcement learning based generative optimization according to example implementations of aspects of the present disclosure.

According to some embodiments, the computing system can perform method 800 for generating an architectural design for a site map. The system can include one or more processors, and one or more non-transitory computer-readable media that collectively store: a generative system and an optimizer.

The generative system can be configured to process a distribution of parameters to generate a result for the site map. In some instances, the generative system is a combination of a procedural system and a machine-learned model. In some instances, the generative system is a diffusion model.

The optimizer can be configured to determine an update for the distribution of parameters to optimize for one or more performance metrics. In some instances, the optimizer is a natural evolution strategy optimization algorithm. In some instances, the optimizer is a stochastic neural architecture search (SNAS) algorithm.

In some instances, the system can obtain a mesh representation of the site map. Additionally, the system can train the generative system using the mesh representation of the site map.

The system can include a generative model configured to process a policy to generate a result and an optimizer configured to determine an update for the policy to optimize for an ecosystem parameter.

At 1002, the system can obtain, from memory, the policy that defines a specific action for each state of a plurality of states in a process.

At 1004, the system can process, using the generative process, the policy to generate a result, the result being associated with a digital representation of the design for the site;

At 1006, the system can calculate, using a fitness function, a performance value associated with the ecosystem parameter based on the result.

At 1008, the system can determine, using the optimizer, an update for the policy based on the performance value and a target.

In some instances, the fitness function is an explicit function that evaluates a reward function of the process.

In some instances, the target is an objective defined by a user indicating whether the result is approaching optimality.

In some instances, the reward function includes the target.

In some instances, the reward function is defined by a machine-learned model.

In some instances, the optimizer evaluates the result and the target to determine the update to the policy to improve a new result in a future iteration.

In some instances, the ecosystem parameter is associated with biodiversity on the site.

In some instances, the ecosystem parameter is a carbon sequestration rate.

In some instances, the ecosystem parameter is a water runoff rate.

In some instances, ecosystem parameter is an air filtration value.

In some instances, the policy is iteratively procedurally translated into a result, the result being a design of the site.

In some instances, the policy controls an iterative procedural system with a particular end result in a design context.

In some instances, the policy influences the generation process from which a design is sampled and used in the design context.

In some instances, the target is defined by a machine-learned model.

In some instances, the optimizer generates the policy.

Figure 11:
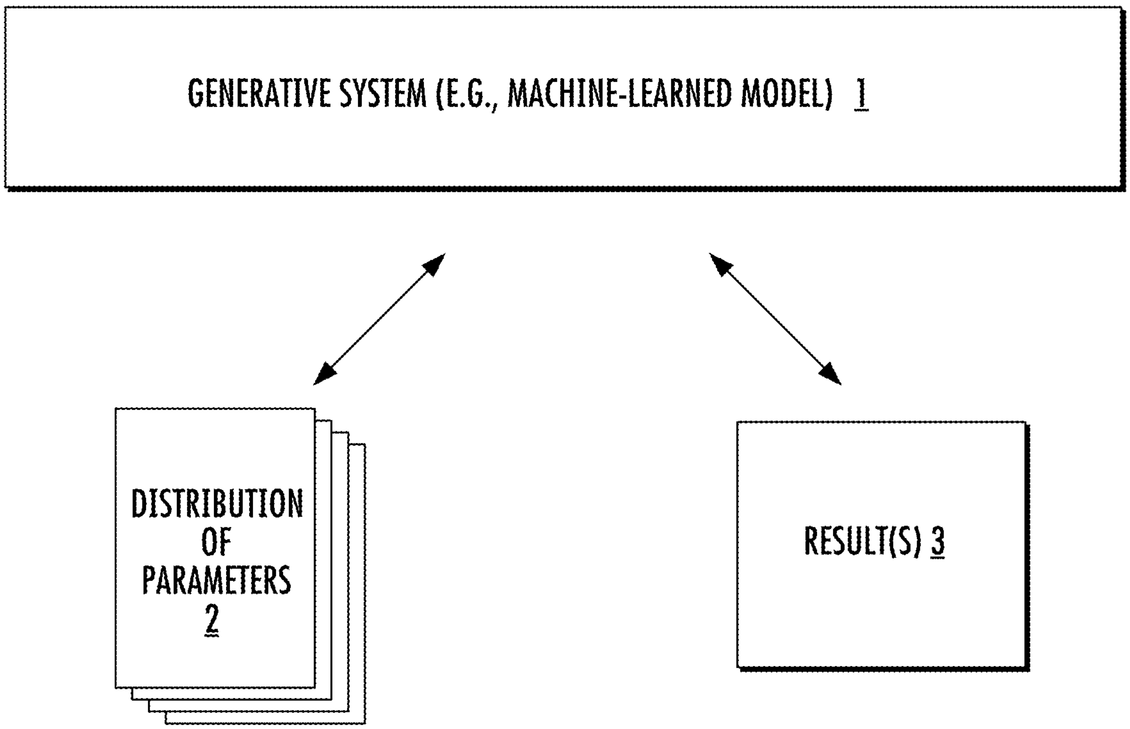
FIG. 11 is a block diagram of an example processing flow for using machine-learned model(s) to process input(s) to generate output(s) according to example implementations of aspects of the present disclosure.

FIG. 11 is a block diagram of an example processing flow for using machine-learned model(s) 1 to process input(s) 2 to generate output(s) 3. According to various embodiments, the machine-learned model(s) 1 can receive data from input(s) 2 and/or output(s) 3. Additionally, the machine-learned model(s) 1 can transmit data to input(s) 2 and/or output(s) 3. For example, the machine-learned model(s) 1 can update input(s) 2 based on the generated output(s) 3.

Machine-learned model(s) 1 can be one or multiple machine-learned models or model components. Example machine-learned models can include neural networks (e.g., deep neural networks). Example machine-learned models can include non-linear models or linear models. Example machine-learned models can use other architectures in lieu of or in addition to neural networks. Example machine-learned models can include decision tree-based models, support vector machines, hidden Markov models, Bayesian networks, linear regression models, k-means clustering models, etc.

Machine-learned model(s) 1 can be or include, or otherwise be representative of any one or more of the machine-learned models described above with respect to the preceding figures. For example, machine-learned model(s) 1 can be or include or otherwise be representative of any one or more of generative systems for distribution, neural field, and diversity search, such as a Policy Gradients with Parameter-Based Exploration (PGPE) algorithm, Separable Natural Evolution Strategy (SNES) algorithm, Coronal Mass Ejections (CMEs) algorithm, CoOperative SYnapse NEuroevolution (COSYNE) algorithm, and/or Genetic algorithms (GA). Although various features, variations, and implementations described below are described with respect to machine-learned model(s) 1, it is to be understood that such features, variations, and implementations are to be understood as described with respect to each of the generative systems for distribution, neural field, and diversity search, such as the PGPE; SNES; CMES; CoSYNE; Genetic algorithms (GA), or any other machine-learned component described herein.

Additionally, the generative systems for policy optimization can include: PPO (proximal policy optimization);

TRPO (trust region policy optimization); SAC (soft actor critic); and COM (conservative offline model-based reinforcement learning).

Example neural networks can include feed-forward neural networks, recurrent neural networks (RNNs), including long short-term memory (LSTM) based recurrent neural networks, convolutional neural networks (CNNs), diffusion models, generative-adversarial networks, or other forms of neural networks. Example neural networks can be deep neural networks. Some example machine-learned models can leverage an attention mechanism such as self-attention. For example, some example machine-learned models can include multi-headed self-attention models.

Machine-learned model(s) 1 can include a single, or multiple instances of the same model configured to operate on data from input(s) 2. Machine-learned model(s) 1 can include multiple different models or multiple different model portions configured to operate on data from input(s) 2.

Machine-learned model(s) 1 can include an ensemble of different models that can cooperatively interact to process data from input(s) 2. For example, a model ensemble can include multiple models that have different attributes (e.g., different architectures, trained with different recipes, etc.). The ensemble can output an overall output based on the individual outputs of the constituent models. In this manner, for instance, the diverse constituent models can work together to provide system-level robustness by effectively aggregating over individual strengths and weaknesses of any given model. The respective individual outputs can be combined in a weighted combination, using a voting or routing mechanism, or a learned output layer (e.g., one or more feedforward or fully-connected layers).

Machine-learned model(s) 1 can employ a mixture-of-experts structure. For example, different portions of a model can learn (explicitly or implicitly) different expertise areas, with pathways through the model being selected by a learned routing mechanism that engages the appropriate expert for a given input (e.g., a given portion of an input, such as on a per-token basis). For example, a feedforward network can be sparsely activated for a given portion of an input based on an output of a routing mechanism that processes the portion of the input. In this manner, for instance, the group of activated weights can form an "expert" that is selected by the router. On each forward pass, only a subset of the total model weights may be engaged, thereby decreasing the quantity of operations performed for processing a given input compared to a densely activated model. In this manner, for instance, the expressive and interpretive power of a high-parameter-count model can be achieved with more compute-efficient forward passes.

Input(s) 2 can generally include or otherwise represent various types of data. Input(s) 2 can include one type or many different types of data. Output(s) 3 can be data of the same type(s) or of different types of data as compared to input(s) 2. Output(s) 3 can include one type or many different types of data.

Example data types for input(s) 2 or output(s) 3 include natural language text data, software code data (e.g., source code, object code, machine code, or any other form of computer-readable instructions or programming languages), machine code data (e.g., binary code, assembly code, or other forms of machine-readable instructions that can be executed directly by a computer's central processing unit), assembly code data (e.g., low-level programming languages that use symbolic representations of machine code instructions to program a processing unit), genetic data or other chemical or biochemical data, image data, audio data, audio-visual data, haptic data, biometric data, medical data, financial data, statistical data, geographical data, astronomical data, historical data, sensor data generally (e.g., digital or analog values, such as voltage or other absolute or relative level measurement values from a real or artificial input, such as from an audio sensor, light sensor, displacement sensor), and the like. Data can be raw or processed and can be in any format or schema.

In multimodal inputs 2 or outputs 3, example combinations of data types include image data and audio data, image data and natural language data, natural language data and software code data, image data and biometric data, sensor data and medical data, etc. It is to be understood that any combination of data types in an input 2 or an output 3 can be present.

An example input 2 can include one or multiple data types, such as the example data types noted above. An example output 3 can include one or multiple data types, such as the example data types noted above. The data type(s) of input 2 can be the same as or different from the data type(s) of output 3. It is to be understood that the example data types noted above are provided for illustrative purposes only. Data types contemplated within the scope of the present disclosure are not limited to those examples noted above.

Figure 12:
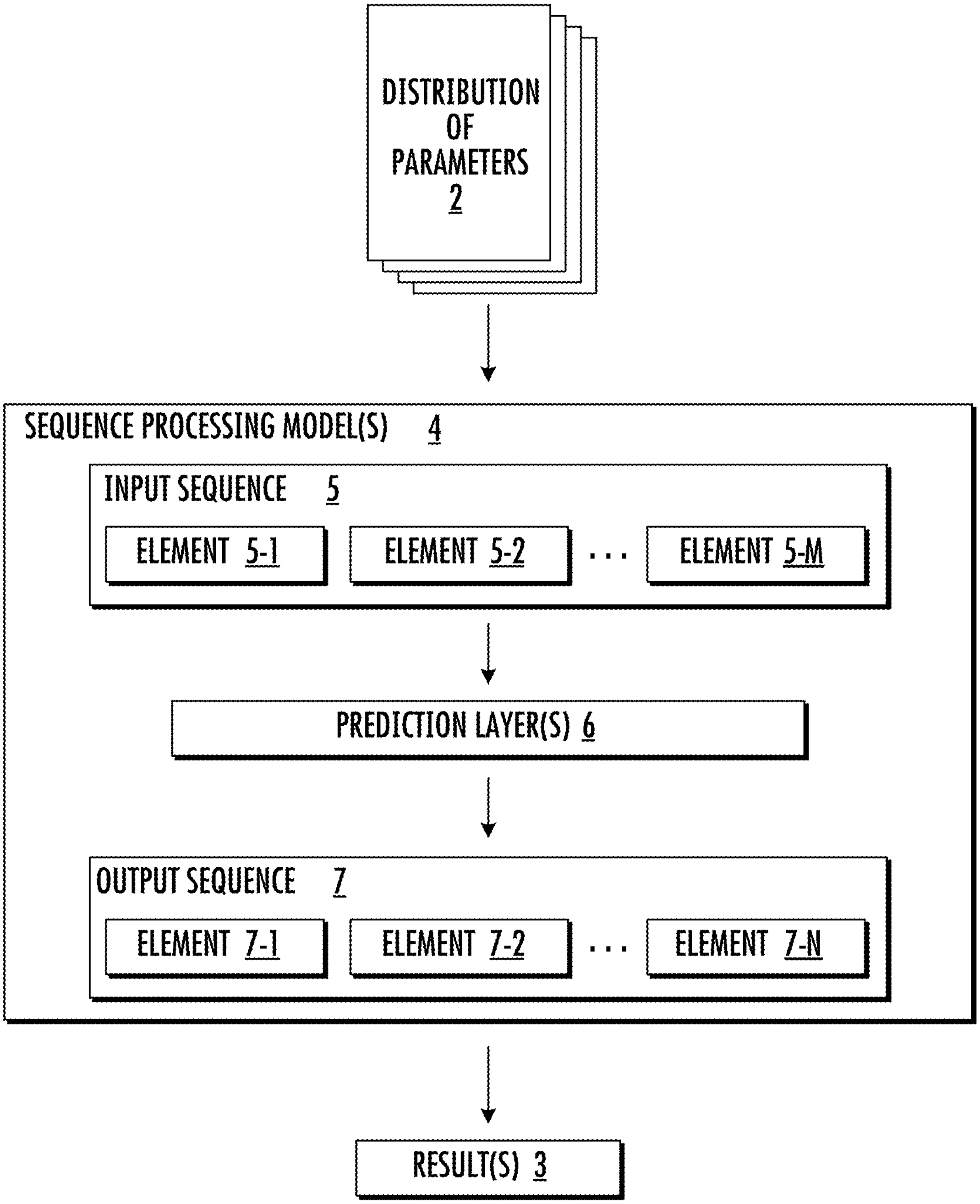
FIG. 12 is a block diagram of an example sequence processing model according to example implementations of aspects of the present disclosure.

FIG. 12 is a block diagram of an example implementation of an example machine-learned model configured to process sequences of information. For instance, an example implementation of machine-learned model(s) 1 can include machine-learned sequence processing model(s) 4. An example system can pass input(s) 2 to sequence processing model(s) 4. Sequence processing model(s) 4 can include one or more machine-learned components. Sequence processing model(s) 4 can process the data from input(s) 2 to obtain an input sequence 5. Input sequence 5 can include one or more input elements 5-1, 5-2, . . . , 5-M, etc. obtained from input(s) 2. Sequence processing model 4 can process input sequence 5 using prediction layer(s) 6 to generate an output sequence 7. Output sequence 7 can include one or more output elements 7-1, 7-2, . . . , 7-N, etc. generated based on input sequence 5. The system can generate output(s) 3 based on output sequence 7.

Sequence processing model(s) 4 can include one or multiple machine-learned model components configured to ingest, generate, or otherwise reason over sequences of information. For example, some example sequence processing models in the text domain are referred to as "Large Language Models," or LLMs. Sequence processing model(s) 4 can process one or multiple types of data simultaneously. Sequence processing model(s) 4 can include relatively large models (e.g., more parameters, computationally expensive, etc.), relatively small models (e.g., fewer parameters, computationally lightweight, etc.), or both.

In general, sequence processing model(s) 4 can obtain input sequence 5 using data from input(s) 2. For instance, input sequence 5 can include a representation of data from input(s) 2 in a format understood by sequence processing model(s) 4. One or more machine-learned components of sequence processing model(s) 4 can ingest the data from input(s) 2, parse the data into pieces compatible with the processing architectures of sequence processing model(s) 4 (e.g., via "tokenization"), and project the pieces into an input space associated with prediction layer(s) 6 (e.g., via "embedding").

Sequence processing model(s) 4 can ingest the data from input(s) 2 and parse the data into a sequence of elements to obtain input sequence 5. For example, a portion of input data from input(s) 2 can be broken down into pieces that collectively represent the content of the portion of the input data. The pieces can provide the elements of the sequence.

Elements 5-1, 5-2, . . . , 5-M can represent, in some cases, building blocks for capturing or expressing meaningful information in a particular data domain. For instance, the elements can describe "atomic units" across one or more domains. For example, for textual input source(s), the elements can correspond to groups of one or more words or sub-word components, such as sets of one or more characters.

For example, elements 5-1, 5-2, . . . , 5-M can represent tokens obtained using a tokenizer. For instance, a tokenizer can process a given portion of an input source and output a series of tokens (e.g., corresponding to input elements 5-1, 5-2, . . . , 5-M) that represent the portion of the input source. Various approaches to tokenization can be used. For instance, textual input source(s) can be tokenized using a byte-pair encoding (BPE) technique. Image-based input source(s) can be tokenized by extracting and serializing patches from an image.

In general, arbitrary data types can be serialized and processed into input sequence 5. It is to be understood that element(s) 5-1, 5-2, . . . , 5-M depicted in FIG. 12 can be the tokens or can be the embedded representations thereof.

Prediction layer(s) 6 can predict one or more output elements 7-1, 7-2, . . . , 7-N based on the input elements. Prediction layer(s) 6 can include one or more machine-learned model architectures, such as one or more layers of learned parameters that manipulate and transform the input(s) to extract higher-order meaning from, and relationships between, input element(s) 5-1, 5-2, . . . , 5-M. In this manner, for instance, example prediction layer(s) 6 can predict new output element(s) in view of the context provided by input sequence 5.

Prediction layer(s) 6 can evaluate associations between portions of input sequence 5 and a particular output element. These associations can inform a prediction of the likelihood that a particular output follows the input context.

A transformer is an example architecture that can be used in prediction layer(s) 4. A transformer is an example of a machine-learned model architecture that uses an attention mechanism to compute associations between items within a context window. The context window can include a sequence that contains input sequence 5 and potentially one or more output element(s) 7-1, 7-2, . . . , 7-N. A transformer block can include one or more attention layer(s) and one or more post-attention layer(s) (e.g., feedforward layer(s), such as a multi-layer perceptron).

Prediction layer(s) 6 can include other machine-learned model architectures in addition to or in lieu of transformer-based architectures. For example, recurrent neural networks (RNNs) and long short-term memory (LSTM) models can also be used, as well as convolutional neural networks (CNNs). In general, prediction layer(s) 6 can leverage various kinds of artificial neural networks that can understand or generate sequences of information.

Output sequence 7 can include or otherwise represent the same or different data types as input sequence 5. For instance, input sequence 5 can represent textual data, and output sequence 7 can represent textual data. Input sequence 5 can represent image, audio, or audiovisual data, and output sequence 7 can represent textual data (e.g., describing the image, audio, or audiovisual data). It is to be understood that prediction layer(s) 6, and any other interstitial model components of sequence processing model(s) 4, can be configured to receive a variety of data types in input sequence(s) 5 and output a variety of data types in output sequence(s) 7.

Output sequence 7 can have various relationships to input sequence 5. Output sequence 7 can be a continuation of input sequence 5. Output sequence 7 can be complementary to input sequence 5. Output sequence 7 can translate, transform, augment, or otherwise modify input sequence 5. Output sequence 7 can answer, evaluate, confirm, or otherwise respond to input sequence 5. Output sequence 7 can implement (or describe instructions for implementing) an instruction provided via input sequence 5.

Output sequence 7 can be generated autoregressively. For instance, for some applications, an output of one or more prediction layer(s) 6 can be passed through one or more output layers (e.g., softmax layer) to obtain a probability distribution over an output vocabulary (e.g., a textual or symbolic vocabulary) conditioned on a set of input elements in a context window. In this manner, for instance, output sequence 7 can be autoregressively generated by sampling a likely next output element, adding that element to the context window, and re-generating the probability distribution based on the updated context window, and sampling a likely next output element, and so forth.

Output sequence 7 can also be generated non-autoregressively. For instance, multiple output elements of output sequence 7 can be predicted together without explicit sequential conditioning on each other.

Output sequence 7 can include one or multiple portions or elements. In an example content generation configuration, output sequence 7 can include multiple elements corresponding to multiple portions of a generated output sequence (e.g., a textual sentence, values of a discretized waveform, computer code, etc.). In an example classification configuration, output sequence 7 can include a single element associated with a classification output. For instance, an output "vocabulary" can include a set of classes into which an input sequence is to be classified. For instance, a vision transformer block can pass latent state information to a multilayer perceptron that outputs a likely class value associated with an input image.

Figure 13:
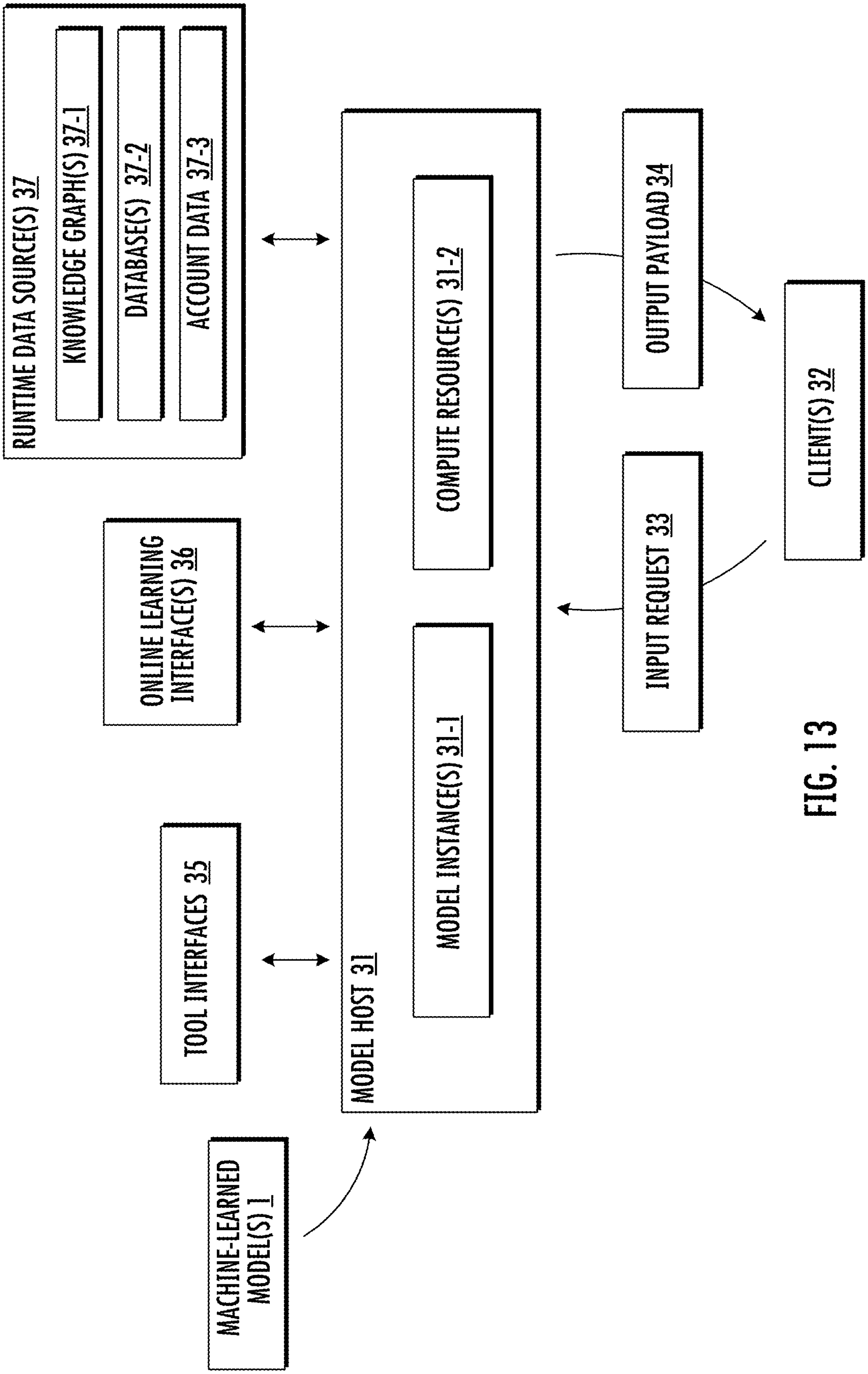
FIG. 13 is a block diagram of an inference system for operating one or more machine-learned model(s) to perform inference according to example implementations of aspects of the present disclosure.

FIG. 13 is a block diagram of an inference system for operating one or more machine-learned model(s) 1 to perform inference (e.g., for training, for deployment, etc.). A model host 31 can receive machine-learned model(s) 1. Model host 31 can host one or more model instance(s) 31-1, which can be one or multiple instances of one or multiple models. Model host 31 can host model instance(s) 31-1 using available compute resources 31-2 associated with model host 31.

Model host 31 can perform inference on behalf of one or more client(s) 32. Client(s) 32 can transmit an input request 33 to model host 31. Using input request 33, model host 31 can obtain input(s) 2 for input to machine-learned model(s) 1. Machine-learned model(s) 1 can process input(s) 2 to generate output(s) 3. Using output(s) 3, model host 31 can return an output payload 34 for responding to input request 33 from client(s) 32. Output payload 34 can include or be based on output(s) 3.

Model host 31 can leverage various other resources and tools to augment the inference task. For instance, model host 31 can communicate with tool interfaces 35 to facilitate tool use by model instance(s) 31-1. Tool interfaces 35 can include local or remote APIs. Tool interfaces 35 can include integrated scripts or other software functionality. Model host 31 can engage online learning interface(s) 36 to facilitate ongoing improvements to machine-learned model(s) 1. For instance, online learning interface(s) 36 can be used within reinforcement learning loops to retrieve user feedback on inferences served by model host 31. Model host 31 can access runtime data source(s) 37 for augmenting input(s) 2 with additional contextual information. For instance, runtime data source(s) 37 can include a knowledge graph 37-1 that facilitates structured information retrieval for information associated with input request(s) 33 (e.g., a search engine service). Runtime data source(s) 37 can include public or private, external or local database(s) 37-2 that can store information associated with input request(s) 33 for augmenting input(s) 2. Runtime data source(s) 37 can include account data 37-3 which can be retrieved in association with a user account corresponding to a client 32 for customizing the behavior of model host 31 accordingly.

Model host 31 can be implemented by one or multiple computing devices or systems. Client(s) 2 can be implemented by one or multiple computing devices or systems, which can include computing devices or systems shared with model host 31.

For example, model host 31 can operate on a server system that provides a machine-learning service to client device(s) that operate client(s) 32 (e.g., over a local or wide-area network). Client device(s) can be end-user devices used by individuals. Client device(s) can be server systems that operate client(s) 32 to provide various functionality as a service to downstream end-user devices.

In some implementations, model host 31 can operate on the same device or system as client(s) 32. Model host 31 can be a machine-learning service that runs on-device to provide machine-learning functionality to one or multiple applications operating on a client device, which can include an application implementing client(s) 32. Model host 31 can be a part of the same application as client(s) 32. For instance, model host 31 can be a subroutine or method implemented by one part of an application, and client(s) 32 can be another subroutine or method that engages model host 31 to perform inference functions within the application. It is to be understood that model host 31 and client(s) 32 can have various different configurations.

Model instance(s) 31-1 can include one or more machine-learned models that are available for performing inference. Model instance(s) 31-1 can include weights or other model components that are stored in persistent storage, temporarily cached, or loaded into high-speed memory. Model instance(s) 31-1 can include multiple instance(s) of the same model (e.g., for parallel execution of more requests on the same model). Model instance(s) 31-1 can include instance(s) of different model(s). Model instance(s) 31-1 can include cached intermediate states of active or inactive model(s) used to accelerate inference of those models. For instance, an inference session with a particular model may generate significant amounts of computational results that can be re-used for future inference runs (e.g., using a KV cache for transformer-based models). These computational results can be saved in association with that inference session so that session can be executed more efficiently when resumed.

Compute resource(s) 31-2 can include one or more processors (central processing units, graphical processing units, tensor processing units, machine-learning accelerators, etc.) connected to one or more memory devices. Compute resource(s) 31-2 can include a dynamic pool of available resources shared with other processes. Compute resource(s) 31-2 can include memory devices large enough to fit an entire model instance in a single memory instance. Compute resource(s) 31-2 can also shard model instance(s) across multiple memory devices (e.g., using data parallelization or tensor parallelization, etc.). This can be done to increase parallelization or to execute a large model using multiple memory devices which individually might not be able to fit the entire model into memory.

Input request 33 can include data for input(s) 2. Model host 31 can process input request 33 to obtain input(s) 2. Input(s) 2 can be obtained directly from input request 33 or can be retrieved using input request 33. Input request 33 can be submitted to model host 31 via an API.

Model host 31 can perform inference over batches of input requests 33 in parallel. For instance, a model instance 31-1 can be configured with an input structure that has a batch dimension. Separate input(s) 2 can be distributed across the batch dimension (e.g., rows of an array). The separate input(s) 2 can include completely different contexts. The separate input(s) 2 can be multiple inference steps of the same task. The separate input(s) 2 can be staggered in an input structure, such that any given inference cycle can be operating on different portions of the respective input(s) 2. In this manner, for instance, model host 31 can perform inference on the batch in parallel, such that output(s) 3 can also contain the batch dimension and return the inference results for the batched input(s) 2 in parallel. In this manner, for instance, batches of input request(s) 33 can be processed in parallel for higher throughput of output payload(s) 34.

Output payload 34 can include or be based on output(s) 3 from machine-learned model(s) 1. Model host 31 can process output(s) 3 to obtain output payload 34. This can include chaining multiple rounds of inference (e.g., iteratively, recursively, across the same model(s) or different model(s)) to arrive at a final output for a task to be returned in output payload 34. Output payload 34 can be transmitted to client(s) 32 via an API.

Online learning interface(s) 36 can facilitate reinforcement learning of machine-learned model(s) 1. Online learning interface(s) 36 can facilitate reinforcement learning with human feedback (RLHF). Online learning interface(s) 36 can facilitate federated learning of machine-learned model(s) 1.

Model host 31 can access a library of pre-trained adapters or LoRA modules that can adapt a baseline model to align its outputs with a desired performance profile, augment model capabilities (e.g., to adapt to a different input modality, etc.), and the like. For instance, model host 31 can receive an input request to load a customized model, and model host 31 can retrieve one or more components to adapt a baseline model to the custom profile. Model host 31 can determine that a particular functionality is needed for a particular task (e.g., based on an output of a model that preprocesses an input) and retrieve a pre-trained component accordingly.

Model host 31 can execute machine-learned model(s) 1 to perform inference for various tasks using various types of data. For example, various different input(s) 2 and output(s) 3 can be used for various different tasks. In some implementations, input(s) 2 can be or otherwise represent image data. Machine-learned model(s) 1 can process the image data to generate an output. As an example, machine-learned model(s) 1 can process the image data to generate an image recognition output (e.g., a recognition of the image data, a latent embedding of the image data, an encoded representation of the image data, a hash of the image data, etc.). As another example, machine-learned model(s) 1 can process the image data to generate an image segmentation output. As another example, machine-learned model(s) 1 can process the image data to generate an image classification output. As another example, machine-learned model(s) 1 can process the image data to generate an image data modification output (e.g., an alteration of the image data, etc.). As another example, machine-learned model(s) 1 can process the image data to generate an encoded image data output (e.g., an encoded and/or compressed representation of the image data, etc.). As another example, machine-learned model(s) 1 can process the image data to generate an upscaled image data output. As another example, machine-learned model(s) 1 can process the image data to generate a prediction output.

In some implementations, the task is a computer vision task. In some cases, input(s) 2 includes pixel data for one or more images and the task is an image processing task. For example, the image processing task can be image classification, where the output is a set of scores, each score corresponding to a different object class and representing the likelihood that the one or more images depict an object belonging to the object class. The image processing task may be object detection, where the image processing output identifies one or more regions in the one or more images and, for each region, a likelihood that region depicts an object of interest. As another example, the image processing task can be image segmentation, where the image processing output defines, for each pixel in the one or more images, a respective likelihood for each category in a predetermined set of categories. For example, the set of categories can be foreground and background. As another example, the set of categories can be object classes. As another example, the image processing task can be depth estimation, where the image processing output defines, for each pixel in the one or more images, a respective depth value. As another example, the image processing task can be motion estimation, where the network input includes multiple images, and the image processing output defines, for each pixel of one of the input images, a motion of the scene depicted at the pixel between the images in the network input.

In some implementations, input(s) 2 can be or otherwise represent natural language data. Machine-learned model(s) 1 can process the natural language data to generate an output. As an example, machine-learned model(s) 1 can process the natural language data to generate a language encoding output. As another example, machine-learned model(s) 1 can process the natural language data to generate a latent text embedding output. As another example, machine-learned model(s) 1 can process the natural language data to generate a translation output. As another example, machine-learned model(s) 1 can process the natural language data to generate a classification output. Another example, machine-learned model(s) 1 can process the natural language data to generate a textual segmentation output. As another example, machine-learned model(s) 1 can process the natural language data to generate a semantic intent output. As another example, machine-learned model(s) 1 can process the natural language data to generate an upscaled text or natural language output (e.g., text or natural language data that is higher quality than the input text or natural language, etc.). As another example, machine-learned model(s) 1 can process the natural language data to generate a prediction output (e.g., one or more predicted next portions of natural language content).

In some implementations, input(s) 2 can be or otherwise represent speech data (e.g., data describing spoken natural language, such as audio data, textual data, etc.). Machine-learned model(s) 1 can process the speech data to generate an output. As an example, machine-learned model(s) 1 can process the speech data to generate a speech recognition output. As another example, machine-learned model(s) 1 can process the speech data to generate a speech translation output. As another example, machine-learned model(s) 1 can process the speech data to generate a latent embedding output. As another example, machine-learned model(s) 1 can process the speech data to generate an encoded speech output (e.g., an encoded and/or compressed representation of the speech data, etc.). As another example, machine-learned model(s) 1 can process the speech data to generate an upscaled speech output (e.g., speech data that is higher quality than the input speech data, etc.). As another example, machine-learned model(s) 1 can process the speech data to generate a textual representation output (e.g., a textual representation of the input speech data, etc.). As another example, machine-learned model(s) 1 can process the speech data to generate a prediction output.

In some implementations, input(s) 2 can be or otherwise represent latent encoding data (e.g., a latent space representation of an input, etc.). Machine-learned model(s) 1 can process the latent encoding data to generate an output. As an example, machine-learned model(s) 1 can process the latent encoding data to generate a recognition output. As another example, machine-learned model(s) 1 can process the latent encoding data to generate a reconstruction output. As another example, machine-learned model(s) 1 can process the latent encoding data to generate a search output. As another example, machine-learned model(s) 1 can process the latent encoding data to generate a reclustering output. As another example, machine-learned model(s) 1 can process the latent encoding data to generate a prediction output.

In some implementations, input(s) 2 can be or otherwise represent statistical data. Statistical data can be, represent, or otherwise include data computed and/or calculated from some other data source. Machine-learned model(s) 1 can process the statistical data to generate an output. As an example, machine-learned model(s) 1 can process the statistical data to generate a recognition output. As another example, machine-learned model(s) 1 can process the statistical data to generate a prediction output. As another example, machine-learned model(s) 1 can process the statistical data to generate a classification output. As another example, machine-learned model(s) 1 can process the statistical data to generate a segmentation output. As another example, machine-learned model(s) 1 can process the statistical data to generate a visualization output. As another example, machine-learned model(s) 1 can process the statistical data to generate a diagnostic output.

In some implementations, input(s) 2 can be or otherwise represent sensor data. Machine-learned model(s) 1 can process the sensor data to generate an output. As an example, machine-learned model(s) 1 can process the sensor data to generate a recognition output. As another example, machine-learned model(s) 1 can process the sensor data to generate a prediction output. As another example, machine-learned model(s) 1 can process the sensor data to generate a classification output. As another example, machine-learned model(s) 1 can process the sensor data to generate a segmentation output. As another example, machine-learned model(s) 1 can process the sensor data to generate a visualization output. As another example, machine-learned model(s) 1 can process the sensor data to generate a diagnostic output. As another example, machine-learned model(s) 1 can process the sensor data to generate a detection output.

In some implementations, machine-learned model(s) 1 can be configured to perform a task that includes encoding input data for reliable and/or efficient transmission or storage (and/or corresponding decoding). For example, the task may be an audio compression task. The input may include audio data, and the output may comprise compressed audio data. In another example, the input includes visual data (e.g., one or more images or videos), the output comprises compressed visual data, and the task is a visual data compression task. In another example, the task may comprise generating an embedding for input data (e.g., input audio or visual data). In some cases, the input includes audio data representing a spoken utterance and the task is a speech recognition task. The output may comprise a text output which is mapped to the spoken utterance. In some cases, the task comprises encrypting or decrypting input data. In some cases, the task comprises a microprocessor performance task, such as branch prediction or memory address translation.

In some implementations, the task is a generative task, and machine-learned model(s) 1 can be configured to output content generated in view of input(s) 2. For instance, input(s) 2 can be or otherwise represent data of one or more modalities that encodes context for generating additional content.

In some implementations, the task can be a text completion task. Machine-learned model(s) 1 can be configured to process input(s) 2 that represent textual data and to generate output(s) 3 that represent additional textual data that completes a textual sequence that includes input(s) 2. For instance, machine-learned model(s) 1 can be configured to generate output(s) 3 to complete a sentence, paragraph, or portion of text that follows from a portion of text represented by input(s) 2.

In some implementations, the task can be an instruction following task. Machine-learned model(s) 1 can be configured to process input(s) 2 that represent instructions to perform a function and to generate output(s) 3 that advance a goal of satisfying the instruction function (e.g., at least a step of a multi-step procedure to perform the function). Output(s) 3 can represent data of the same or of a different modality as input(s) 2. For instance, input(s) 2 can represent textual data (e.g., natural language instructions for a task to be performed) and machine-learned model(s) 1 can process input(s) 2 to generate output(s) 3 that represent textual data responsive to the instructions (e.g., natural language responses, programming language responses, machine language responses, etc.). Input(s) 2 can represent image data (e.g., image-based instructions for a task to be performed, optionally accompanied by textual instructions) and machine-learned model(s) 1 can process input(s) 2 to generate output(s) 3 that represent textual data responsive to the instructions (e.g., natural language responses, programming language responses, machine language responses, etc.). One or more output(s) 3 can be iteratively or recursively generated to sequentially process and accomplish steps toward accomplishing the requested functionality. For instance, an initial output can be executed by an external system or be processed by machine-learned model(s) 1 to complete an initial step of performing a function. Multiple steps can be performed, with a final output being obtained that is responsive to the initial instructions.

In some implementations, the task can be a question answering task. Machine-learned model(s) 1 can be configured to process input(s) 2 that represent a question to answer and to generate output(s) 3 that advance a goal of returning an answer to the question (e.g., at least a step of a multi-step procedure to perform the function). Output(s) 3 can represent data of the same or of a different modality as input(s) 2. For instance, input(s) 2 can represent textual data (e.g., natural language instructions for a task to be performed) and machine-learned model(s) 1 can process input(s) 2 to generate output(s) 3 that represent textual data responsive to the question (e.g., natural language responses, programming language responses, machine language responses, etc.). Input(s) 2 can represent image data (e.g., image-based instructions for a task to be performed, optionally accompanied by textual instructions) and machine-learned model(s) 1 can process input(s) 2 to generate output(s) 3 that represent textual data responsive to the question (e.g., natural language responses, programming language responses, machine language responses, etc.). One or more output(s) 3 can be iteratively or recursively generated to sequentially process and accomplish steps toward answering the question. For instance, an initial output can be executed by an external system or be processed by machine-learned model(s) 1 to complete an initial step of obtaining an answer to the question (e.g., querying a database, performing a computation, executing a script, etc.). Multiple steps can be performed, with a final output being obtained that is responsive to the question.

In some implementations, the task can be an image generation task. Machine-learned model(s) 1 can be configured to process input(s) 2 that represent context regarding a desired portion of image content. The context can include text data, image data, audio data, etc. Machine-learned model(s) 1 can be configured to generate output(s) 3 that represent image data that depicts imagery related to the context. For instance, machine-learned model(s) 1 can be configured to generate pixel data of an image. Values for channel(s) associated with the pixels in the pixel data can be selected based on the context (e.g., based on a probability determined based on the context).

In some implementations, the task can be a data generation task. Machine-learned model(s) 1 can be configured to process input(s) 2 that represent context regarding a desired portion of data (e.g., data from various data domains, such as sensor data, image data, multimodal data, statistical data, etc.). The desired data can be, for instance, synthetic data for training other machine-learned models. The context can include arbitrary data type(s). Machine-learned model(s) 1 can be configured to generate output(s) 3 that represent data that aligns with the desired data. For instance, machine-learned model(s) 1 can be configured to generate data values for populating a dataset. Values for the data object(s) can be selected based on the context (e.g., based on a probability determined based on the context).

Figure 14:
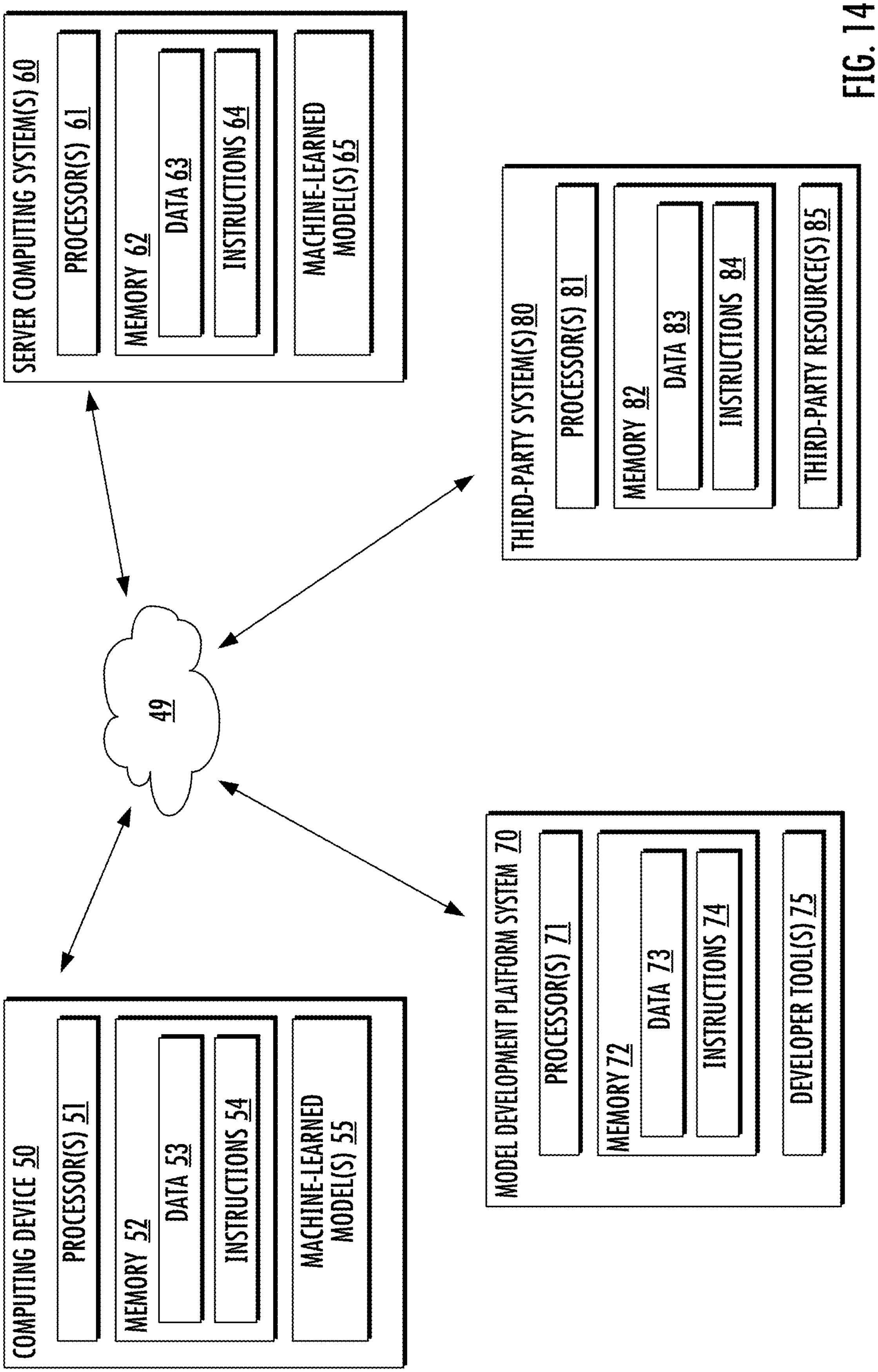
FIG. 14 is a block diagram of an example networked computing system according to example implementations of aspects of the present disclosure.

FIG. 14 is a block diagram of an example networked computing system that can perform aspects of example implementations of the present disclosure. The system can include a number of computing devices and systems that are communicatively coupled over a network 49. An example computing device 50 is described to provide an example of a computing device that can perform any aspect of the present disclosure (e.g., implementing model host 31, client(s) 32, or both). An example server computing system 60 is described as an example of a server computing system that can perform any aspect of the present disclosure (e.g., implementing model host 31, client(s) 32, or both). Computing device 50 and server computing system(s) 60 can cooperatively interact (e.g., over network 49) to perform any aspect of the present disclosure (e.g., implementing model host 31, client(s) 32, or both). Model development platform system 70 is an example system that can host or serve model development platform(s) 12 for development of machine-learned models. Third-party system(s) 80 are example system(s) with which any computing device 50, server computing system(s) 60, or model development platform system(s) 70 can interact in the performance of various aspects of the present disclosure (e.g., engaging third-party tools, accessing third-party databases or other resources, etc.).

Network 49 can be any type of communications network, such as a local area network (e.g., intranet), wide area network (e.g., Internet), or some combination thereof and can include any number of wired or wireless links. In general, communication over network 49 can be carried via any type of wired or wireless connection, using a wide variety of communication protocols (e.g., TCP/IP, HTTP, SMTP, FTP), encodings or formats (e.g., HTML, XML), or protection schemes (e.g., VPN, secure HTTP, SSL). Network 49 can also be implemented via a system bus. For instance, one or more devices or systems can be co-located with, contained by, or otherwise integrated into one or more other devices or systems.

Computing device 50 can be any type of computing device, such as, for example, a personal computing device (e.g., laptop or desktop), a mobile computing device (e.g., smartphone or tablet), a gaming console or controller, a wearable computing device, an embedded computing device, a server computing device, a virtual machine operating on a host device, or any other type of computing device. Computing device 50 can be a client computing device. Computing device 50 can be an end-user computing device. Computing device 50 can be a computing device of a service provided that provides a service to an end user (who may use another computing device to interact with computing device 50).

Computing device 50 can include one or more processors 51 and a memory 52. Processor(s) 51 can be any suitable processing device (e.g., a processor core, a microprocessor, an ASIC, an FPGA, a controller, a microcontroller, etc.) and can be one processor or a plurality of processors that are operatively connected. Memory 52 can include one or more non-transitory computer-readable storage media, such as HBM, RAM, ROM, EEPROM, EPROM, flash memory devices, magnetic disks, etc., and combinations thereof. Memory 52 can store data 53 and instructions 54 which can be executed by processor(s) 51 to cause computing device 50 to perform operations. The operations can implement any one or multiple features described herein. The operations can implement example methods and techniques described herein.

Computing device 50 can also include one or more input components that receive user input. For example, a user input component can be a touch-sensitive component (e.g., a touch-sensitive display screen or a touch pad) that is sensitive to the touch of a user input object (e.g., a finger or a stylus). The touch-sensitive component can serve to implement a virtual keyboard. Other example user input components include a microphone, camera, a physical keyboard or other buttons, or other means by which a user can provide user input.

Computing device 50 can store or include one or more machine-learned models 55. Machine-learned models 55 can include one or more machine-learned model(s) 1, such as a sequence processing model 4. Machine-learned models 55 can include one or multiple model instance(s) 31-1. Machine-learned model(s) 55 can be received from server computing system(s) 60, model development platform system 70, third party system(s) 80 (e.g., an application distribution platform), or developed locally on computing device 50. Machine-learned model(s) 55 can be loaded into memory 52 and used or otherwise implemented by processor(s) 51. Computing device 50 can implement multiple parallel instances of machine-learned model(s) 55.

Server computing system(s) 60 can include one or more processors 61 and a memory 62. Processor(s) 61 can be any suitable processing device (e.g., a processor core, a microprocessor, a controller, a microcontroller) and can be one processor or a plurality of processors that are operatively connected. Memory 62 can include one or more non-transitory computer-readable storage media. Memory 62 can store data 63 and instructions 64 which can be executed by processor(s) 61 to cause server computing system(s) 60 to perform operations. The operations can implement any one or multiple features described herein. The operations can implement example methods and techniques described herein.

In some implementations, server computing system 60 includes or is otherwise implemented by one or multiple server computing devices. In instances in which server computing system 60 includes multiple server computing devices, such server computing devices can operate according to sequential computing architectures, parallel computing architectures, or some combination thereof.

Server computing system 60 can store or otherwise include one or more machine-learned models 65. Machine-learned model(s) 65 can be the same as or different from machine-learned model(s) 55. Machine-learned models 65 can include one or more machine-learned model(s) 1, such as a sequence processing model 4. Machine-learned models 65 can include one or multiple model instance(s) 31-1. Machine-learned model(s) 65 can be received from computing device 50, model development platform system 70, third party system(s) 80, or developed locally on server computing system(s) 60. Machine-learned model(s) 65 can be loaded into memory 62 and used or otherwise implemented by processor(s) 61. Server computing system(s) 60 can implement multiple parallel instances of machine-learned model(s) 65.

In an example configuration, machine-learned models 65 can be included in or otherwise stored and implemented by server computing system 60 to establish a client-server relationship with computing device 50 for serving model inferences. For instance, server computing system(s) 60 can implement model host 31 on behalf of client(s) 32 on computing device 50. For instance, machine-learned models 65 can be implemented by server computing system 60 as a portion of a web service (e.g., remote machine-learned model hosting service, such as an online interface for performing machine-learned model operations over a network on server computing system(s) 60). For instance, server computing system(s) 60 can communicate with computing device 50 over a local intranet or internet connection. For instance, computing device 50 can be a workstation or endpoint in communication with server computing system(s) 60, with implementation of machine-learned models 65 being managed by server computing system(s) 60 to remotely perform inference (e.g., for runtime or training operations), with output(s) returned (e.g., cast, streamed, etc.) to computing device 50. Machine-learned models 65 can work cooperatively or intraoperatively with machine-learned models 55 on computing device 50 to perform various tasks.

Model development platform system(s) 70 can include one or more processors 71 and a memory 72. Processor(s) 71 can be any suitable processing device (e.g., a processor core, a microprocessor, a controller, a microcontroller, etc.) and can be one processor or a plurality of processors that are operatively connected. Memory 72 can include one or more non-transitory computer-readable storage media. Memory 72 can store data 73 and instructions 74 which can be executed by processor(s) 71 to cause model development platform system(s) 70 to perform operations. The operations can implement any one or multiple features described herein. The operations can implement example methods and techniques described herein. Example operations include the functionality described herein with respect to model development platform 12. This and other functionality can be implemented by developer tool(s) 75.

Third-party system(s) 80 can include one or more processors 81 and a memory 82. Processor(s) 81 can be any suitable processing device (e.g., a processor core, a microprocessor, an ASIC, an FPGA, a controller, a microcontroller, etc.) and can be one processor or a plurality of processors that are operatively connected. Memory 82 can include one or more non-transitory computer-readable storage media. Memory 82 can store data 83 and instructions 84 which can be executed by processor(s) 81 to cause third-party system(s) 80 to perform operations. The operations can implement any one or multiple features described herein. The operations can implement example methods and techniques described herein. Example operations include the functionality described herein with respect to tools and other external resources called when training or performing inference with machine-learned model(s) 1, 4, 16, 20, 55, 65, etc. (e.g., third-party resource(s) 85).

FIG. 14 illustrates one example arrangement of computing systems that can be used to implement the present disclosure. Other computing system configurations can be used as well. For example, in some implementations, one or both of computing system 50 or server computing system(s) 60 can implement all or a portion of the operations of model development platform system 70. For example, computing system 50 or server computing system(s) 60 can implement developer tool(s) 75 (or extensions thereof) to develop, update/train, or refine machine-learned models 1, 4, 16, 20, 55, 65, etc. using one or more techniques described herein with respect to model alignment toolkit 17. In this manner, for instance, computing system 50 or server computing system(s) 60 can develop, update/train, or refine machine-learned models based on local datasets (e.g., for model personalization/customization, as permitted by user data preference selections).

The technology discussed herein makes reference to servers, databases, software applications, and other computer-based systems, as well as actions taken, and information sent to and from such systems. The inherent flexibility of computer-based systems allows for a great variety of possible configurations, combinations, and divisions of tasks and functionality between and among components. For instance, processes discussed herein can be implemented using a single device or component or multiple devices or components working in combination. Databases and applications can be implemented on a single system or distributed across multiple systems. Distributed components can operate sequentially or in parallel.

While the present subject matter has been described in detail with respect to various specific example embodiments thereof, each example is provided by way of explanation, not limitation of the disclosure. Those skilled in the art, upon attaining an understanding of the foregoing, can readily produce alterations to, variations of, and equivalents to such embodiments. Accordingly, the subject disclosure does not preclude inclusion of such modifications, variations or additions to the present subject matter as would be readily apparent to one of ordinary skill in the art. For instance, features illustrated or described as part of one embodiment can be used with another embodiment to yield a still further embodiment. Thus, it is intended that the present disclosure covers such alterations, variations, and equivalents.

Aspects of the disclosure have been described in terms of illustrative embodiments thereof. Any and all features in the following claims can be combined or rearranged in any way possible, including combinations of claims not explicitly enumerated in combination together, as the example claim dependencies listed herein should not be read as limiting the scope of possible combinations of features disclosed herein. Accordingly, the scope of the present disclosure is by way of example rather than by way of limitation, and the subject disclosure does not preclude inclusion of such modifications, variations or additions to the present subject matter as would be readily apparent to one of ordinary skill in the art. Moreover, terms are described herein using lists of example elements joined by conjunctions such as "and," "or," "but," etc. It should be understood that such conjunctions are provided for explanatory purposes only. Clauses and other sequences of items joined by a particular conjunction such as "or," for example, can refer to "and/or," "at least one of," "any combination of" example elements listed therein, etc. Terms such as "based on" should be understood as "based at least in part on."

The term "can" should be understood as referring to a possibility of a feature in various implementations and not as prescribing an ability that is necessarily present in every implementation. For example, the phrase "X can perform Y" should be understood as indicating that, in various implementations, X has the potential to be configured to perform Y, and not as indicating that in every instance X must always be able to perform Y. It should be understood that, in various implementations, X might be unable to perform Y and remain within the scope of the present disclosure.

The term "may" should be understood as referring to a possibility of a feature in various implementations and not as prescribing an ability that is necessarily present in every implementation. For example, the phrase "X may perform Y" should be understood as indicating that, in various implementations, X has the potential to be configured to perform Y, and not as indicating that in every instance X must always be able to perform Y. It should be understood that, in various implementations, X might be unable to perform Y and remain within the scope of the present disclosure.

What is claimed is:

1. A computing system for generating a design for a site, comprising of:

one or more processors; and one or more non-transitory computer-readable media that collectively store:

a neural network configured to process neural field parameters to generate an output of a field of arbitrary dimensions;

a generative system, the generative system is configured to process the field of arbitrary dimensions to generate a result; and an optimizer, wherein the optimizer is configured to determine an update for the neural field parameters to optimize for one or more performance metrics;

instructions that, when executed by the one or more processors, cause the computing system to perform operations, the operations comprising:

processing, using the neural network, the neural field parameters to generate the field of arbitrary dimensions;

processing, using the generative system, the neural field parameters to generate a first result, wherein the first result includes a first plant species planted within an array of points on the site, the first result being associated with a digital representation of the design for the site;

simulating, based on the first result, a surface temperature of a structure on the site;

calculating, using a fitness function, a first performance value associated with the one or more performance metrics based on the first result, the surface temperature of the structure being one of the one or more performance metrics; and determining, using the optimizer, an update for the neural field parameters based on the first result.

2. The computing system of claim 1, the operations further comprising:

determining an updated neural field parameters based on the update for the neural field parameters;

processing, using the generative system, the updated neural field parameters to generate a second result; and presenting, on a display, the digital representation for the design based on the second result.

3. The computing system of claim 1, wherein the neural network is an implicit function that receives inputs of arbitrary dimensions.

4. The computing system of claim 1, wherein the result is a distribution associated with the neural field parameters.

5. The computing system of claim 1, wherein the fitness function includes an explicit function that processes the first result to generate a single value representing an optimality of a distribution associated with the neural field parameters.

6. The computing system of claim 1, wherein the optimizer evaluates the result against a target to determine how the neural field parameters is modified in order to improve the result in a future iteration.

7. The computing system of claim 6, wherein the target includes a defined objective that indicates whether the result is approaching optimality.

8. The computing system of claim 1, wherein the neural field parameters include a set of vector positions in a cartesian space.

9. The computing system of claim 1, wherein the neural field parameters include an array of parameters describing a transformation of input objects.

10. The computing system of claim 1, the operations further comprising:

receiving user input, the user input defining a sample of the distribution representative of an intended output field.

11. The computing system of claim 1, wherein the result includes a formation of a landscape.

12. The computing system of claim 1, wherein the result includes a structure that alters the distribution of sunlight, wind, and rain on a site.

13. The computing system of claim 1, wherein the result includes a second plant species planted within an array of points on the site, and wherein the second plant species is different than the first plant species.

14. The computing system of claim 1, wherein the result includes a spatial distribution of designed elements that impact ecosystem parameters.

15. The computing system of claim 1, wherein the fitness function determines biodiversity value on the site or carbon sequestration rates for the site.

16. The computing system of claim 1, wherein the fitness function determines water runoff rates for the site and determines air filtration associated with the site.

17. The computing system of claim 1, the operations further comprising:

generating, using the neural network and the generative system, a second result for a second site based on a transfer learning technique.

18. The computing system of claim 1, wherein the result includes a location on the site and an angle position for each solar panel in a plurality of solar panels.

19. A computer-implemented method for generating a design for a site, comprising:

processing, using a neural network, a neural field parameters to generate a field of arbitrary dimensions;

processing, using a generative system, the neural field parameters to generate a first result, wherein the first result includes a first plant species planted within an array of points on the site, the first result being associated with a digital representation of the design for the site;

simulating, based on the first result, a surface temperature of a structure on the site;

calculating, using a fitness function, a first performance value associated with the one or more performance metrics based on the first result, the surface temperature of the structure being one of the one or more performance metrics; and determining, using an optimizer, an update for the distribution of parameters based on the first result.

20. One or more non-transitory computer-readable media storing instructions that are executable by a computing system to perform operations, the operations comprising:

processing, using a neural network, a neural field parameters to generate a field of arbitrary dimensions;

processing, using a generative system, the neural field parameters to generate a first result, wherein the first result includes a first plant species planted within an array of points on the site, the first result being associated with a digital representation of the design for the site;

simulating, based on the first result, a surface temperature of a structure on the site;

calculating, using a fitness function, a first performance value associated with the one or more performance metrics based on the first result, the surface temperature of the structure being one of the one or more performance metrics; and determining, using an optimizer, an update for the distribution of parameters based on the first result.

* * * * *